(12) United States Patent
McComber et al.

(10) Patent No.: US 10,346,579 B2
(45) Date of Patent: Jul. 9, 2019

(54) INTERACTIVE ROUTING OF CONNECTIONS IN CIRCUIT USING AUTO WELDING AND AUTO CLONING

(71) Applicant: Synopsys, Inc., Mountain View, CA (US)

(72) Inventors: Philippe Aubert McComber, San Jose, CA (US); Hsiang-Wen Jimmy Lin, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/982,995

(22) Filed: May 17, 2018

(65) Prior Publication Data

US 2018/0268097 A1    Sep. 20, 2018

Related U.S. Application Data

(63) Continuation of application No. 15/376,457, filed on Dec. 12, 2016, now Pat. No. 10,002,224.

(60) Provisional application No. 62/301,042, filed on Feb. 29, 2016, provisional application No. 62/301,050, filed on Feb. 29, 2016, provisional application No. 62/301,048, filed on Feb. 29, 2016.

(51) Int. Cl.
*G06F 17/50* (2006.01)
(52) U.S. Cl.
CPC .................. *G06F 17/5077* (2013.01)
(58) Field of Classification Search
CPC .................................................. G06F 17/5077

USPC .................................................. 716/126, 130
See application file for complete search history.

(56) References Cited

U.S. PATENT DOCUMENTS

| | | | |
|---|---|---|---|
| 7,823,113 | B1 | 10/2010 | Waller et al. |
| 8,863,063 | B2 | 10/2014 | Becker et al. |
| 10,002,224 | B2 * | 6/2018 | McComber et al. ........ G06F 17/5077 |
| 2006/0288323 | A1 | 12/2006 | Birch |
| 2013/0207199 | A1 | 8/2013 | Becker et al. |
| 2014/0035053 | A1 | 2/2014 | Jamil et al. |
| 2016/0372414 | A1 | 12/2016 | Song et al. |
| 2017/0249414 | A1 | 8/2017 | Lin et al. |

OTHER PUBLICATIONS

PCT International Search Report and Written Opinion, PCT Application No. PCT/US2017/018524, dated Jun. 12, 2017, 18 pages.
(Continued)

*Primary Examiner* — Sun J Lin
(74) *Attorney, Agent, or Firm* — Fenwick & West LLP

(57) ABSTRACT

Embodiments relate to an interactive routing of connections in a circuit where connections associated with an initial pin of a circuit element (e.g., a row of FinFETs) are replicated in association with at least one other pin of the circuit element or a different circuit element in the circuit. The replication of connections can be performed intelligently by taking into account mapping of pins as well as design rules or other restrictions imposed on the circuit. The connections can be in form of trunks and branches, and are displayed as user inputs are received. A digital representation of the circuit with the connections as displayed is also generated. At least some of the connections in the circuit are replicated without individual user inputs based on user inputs associated with a connection to the initial pin.

20 Claims, 18 Drawing Sheets

(56) References Cited

OTHER PUBLICATIONS

PCT Invitation to Pay Additional Fees, PCT Application No. PCT/US17/18524, dated Apr. 21, 2017, 2 pages.

* cited by examiner

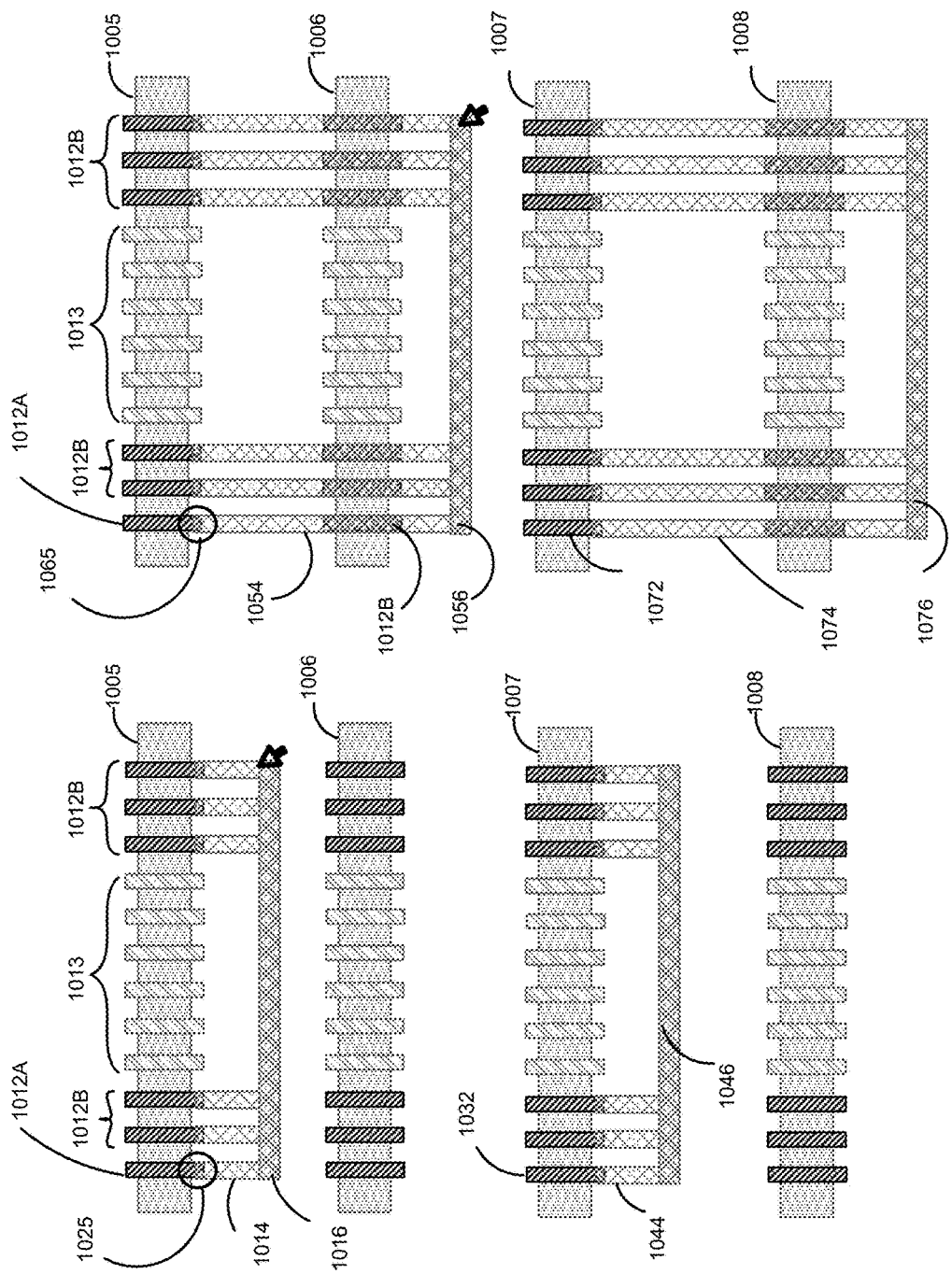

INTERACTIVE ROUTING OF CONNECTIONS IN CIRCUIT USING AUTO WELDING AND AUTO CLONING

CROSS-REFERENCE TO RELATED APPLICATIONS

This application is a continuation of U.S. patent application Ser. No. 15/376,457 filed on Dec. 12, 2016, which claims priority under 35 U.S.C. § 119(e) to U.S. Provisional Patent Application Ser. No. 62/301,050 entitled "Method to quickly perform complex trunk type interactive routing for rows of MOSFET transistors" and filed on Feb. 29, 2016; U.S. Provisional Patent Application Ser. No. 62/301,048 entitled "Method to automatically reproduce routing patterns when interactively routing rows of MOSFET transistors" and filed on Feb. 29, 2016; and U.S. Provisional Patent Application Ser. No. 62/301,042, entitled "Method to quickly and intuitively draw cloned wire connections between rows of MOSFET transistors using interactive router" and filed on Feb. 29, 2016, which are incorporated herein by reference in their entirety.

BACKGROUND

1. Field of the Invention

This disclosure relates generally to layout designing for semiconductor circuits, and more specifically to routing circuit elements such as Fin Field Effect Transistors (FinFETs) using an interactive user interface.

2. Description of Related Art

Circuit layout designing is often performed during a chip design process. Some circuit layout design tools use Follow-The-Cursor (FTC) interactive routing approach that allows users to draw routing connections from a transistor by moving a cursor on a screen. Such circuit layout design tools may first draw a horizontal trunk and then draw individual connections to the MOSFET transistors' gates, sources, or drains based on user input.

Circuit designs including FinFETs, however, pose a new challenge to such FTC interactive routing approach. When FinFETs are used in circuit designs, tens or even hundreds of connections are made to or from a single row of FinFETs. It is very time consuming and inefficient to make such connections to or from FinFETs by individual manual mouse clicks. Some existing solutions such as point-to-point interactive routers (also known as "guided routing routers") may be applied. But even such point-to-point interactive routers are limited in application since the actual routing results are only instantiated on the last mouse click. In addition, non-interactive routing tools like batch routers do not to afford the fine-grained controls to the users for creating interconnections that precisely match what the users intend.

Furthermore, connections made for a row of FinFETs are typically duplicated in other rows FinFETs or applied in the same form or in a modified form. However, it is difficult for the users to know in advance whether a specific connection for a FinFET can be successfully duplicated to another FinFET in the same form or in a modified form without causing any conflicts with other components or connections in a circuit. Accordingly, many rounds of iterations may be repeated before a viable configuration applicable to all FinFETs can be achieved, resulting in waste in time and cost.

SUMMARY

Embodiments relate to routing connections in a circuit. Selection of an initial pin of a circuit element in the circuit is received followed by receiving selection of an end pin of the circuit element. The end pin of the circuit element separated from the initial pin by at least one intermediate pin of the circuit element. A digital representation of the circuit connecting the initial pin, the end pin and the at least one intermediate pin to a first trunk is generated without receiving a user input representing selection of the at least one intermediate pin.

Embodiments relates to replicating routings in at least one circuit element. Mapping information indicating mapping of pins of at least one circuit element in the circuit. Selection of a first initial pin of the at least one circuit element is received. Selection of a first end pin of the at least one circuit element is received after receiving selection of the first initial pin. The mapping information indicates mapping of a second initial pin of the at least one circuit element to the first initial pin and mapping of a second end pin of the at least one circuit element to the first end pin. A digital representation of the circuit connecting the first initial pin to the first end pin and connecting the second initial pin to the second end pin is generated without receiving a user input representing selection of the second initial pin or the second end pin.

BRIEF DESCRIPTION OF THE DRAWINGS

FIGS. 10A and 10B are diagrams illustrating different examples of routing connections generated by the interactive routing system based on different user inputs after selection of an initial pin and before selection of a second pin of a circuit element, according to one embodiment.

DETAILED DESCRIPTION OF EMBODIMENTS

Figure 1:
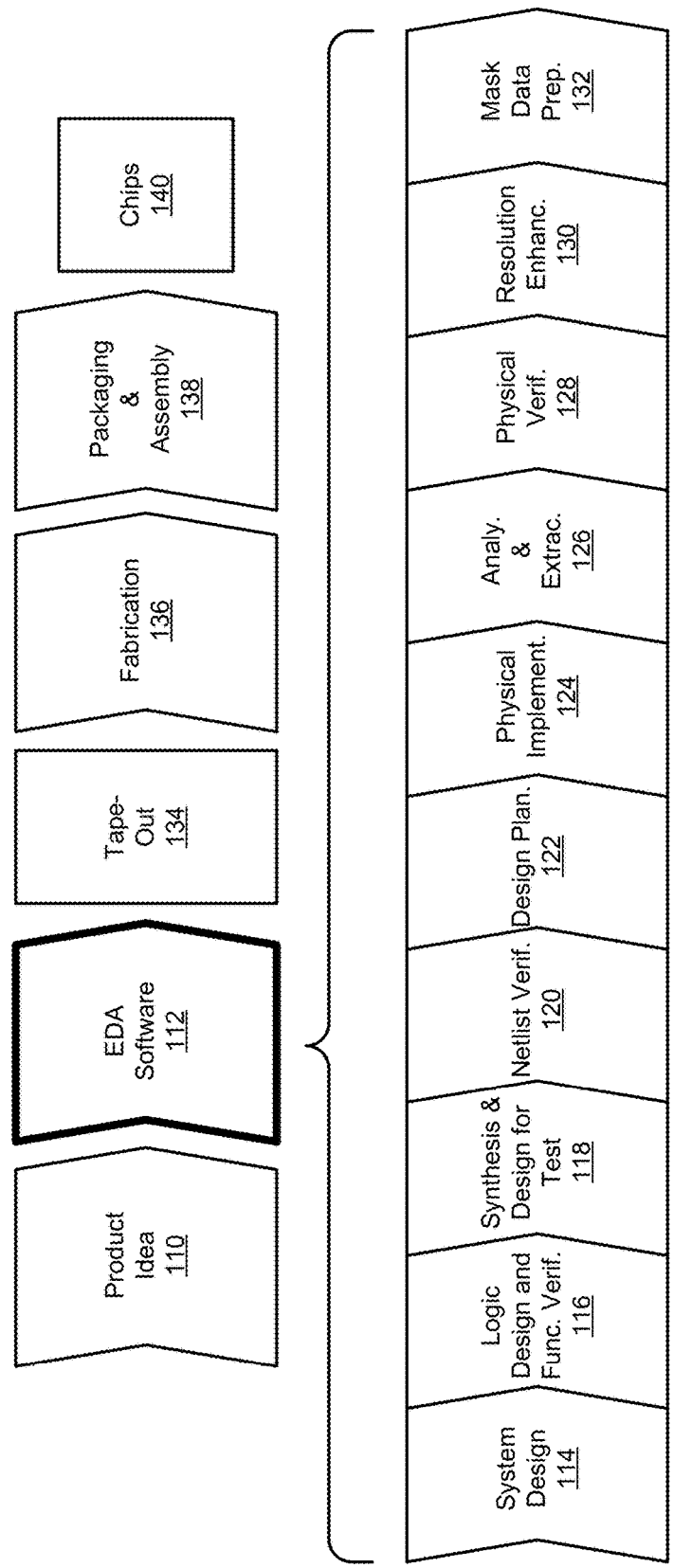
FIG. 1 is a flowchart illustrating various operations for designing and fabricating an integrated circuit, according to one embodiment.

The figures and the following description relate to example embodiments by way of illustration only. It should be noted that from the following discussion, alternative embodiments of the structures and methods disclosed herein will be readily recognized as viable alternatives that may be employed.

Embodiments relate to routing of connections in a circuit where at least one connection to a circuit element (e.g., a row of FinFETs) is automatically formed based on a user input for another connection. When user inputs for connections of an initial pin and an end pin of a circuit element are received, connections to intermediate pins in the circuit elements are automatically formed without receiving separate user inputs for the intermediate pins. In addition or alternatively, a connection to at least one other pin of the same circuit element or a different circuit element in the circuit may be replicated. The replication of connections may be performed intelligently by taking into account the mapping of pins as well as design rules or other restrictions imposed on the circuit. The connections may be in the form of trunks and branches, and are displayed interactively as user inputs are received. After the user inputs are received, a digital representation of the circuit with the connections, as displayed, is generated. By automatically establishing connections to intermediate pins or automatically replicating the connections, the routing of connections in the circuit can be made more efficient and less time consuming.

A circuit element described herein refers to an element in a circuit layout. The circuit element may be an active circuit element (e.g., transistor) and passive circuit element (e.g., resistor, capacitor and inductor). In one example, the circuit element is a row of FinFETs with multiple pins.

A pin described herein refers to a terminal of a circuit element that may be used to establish connection to one or more terminals of the same or a different circuit element. The pins include an active pin that are connected to one or more terminals and an inactive pin whose connection is disabled.

An initial pin described herein refers to a pin of the circuit element selected first by a user input (e.g., a mouse click on the pin) to initiate the operation of automatically connecting one or more pins or to replicate one or more connections in the circuit.

An end pin described herein refers to a pin, the selection of which concludes the operation of automatically connecting one or more pins or replicating one or more connections initiated by the selection of a counterpart initial pin.

An intermediate pin described here refers to a pin between the initial pin and the end pin, the connection of which is automatically established by the selection of the initial pin and the end pin without an additional user input.

A branch described herein refers to a connection directly extending to or from a pin.

A trunk described herein refers to a connection that is connected to a plurality of pins. The trunk may extend in a direction that form an angle (e.g., 90 degrees) relative to a direction along which a branch connected to the trunk extends. The trunk may be connected to a pin via a corresponding branch.

Overview of EDA Design Flow

FIG. 1 is a flowchart illustrating various operations for designing and fabricating an integrated circuit, according to one embodiment. The design process 100 starts with the generation of a product idea 110, which is realized during a design process that uses electronic design automation (EDA) software 112. When the design is finalized, it can be taped-out 134. After tape-out, a semiconductor die is fabricated 136 to form the various objects (e.g., gates, metal layers, vias) in the integrated circuit design. Packaging and assembly processes 138 are performed, which result in finished chips 140.

Figure 2:
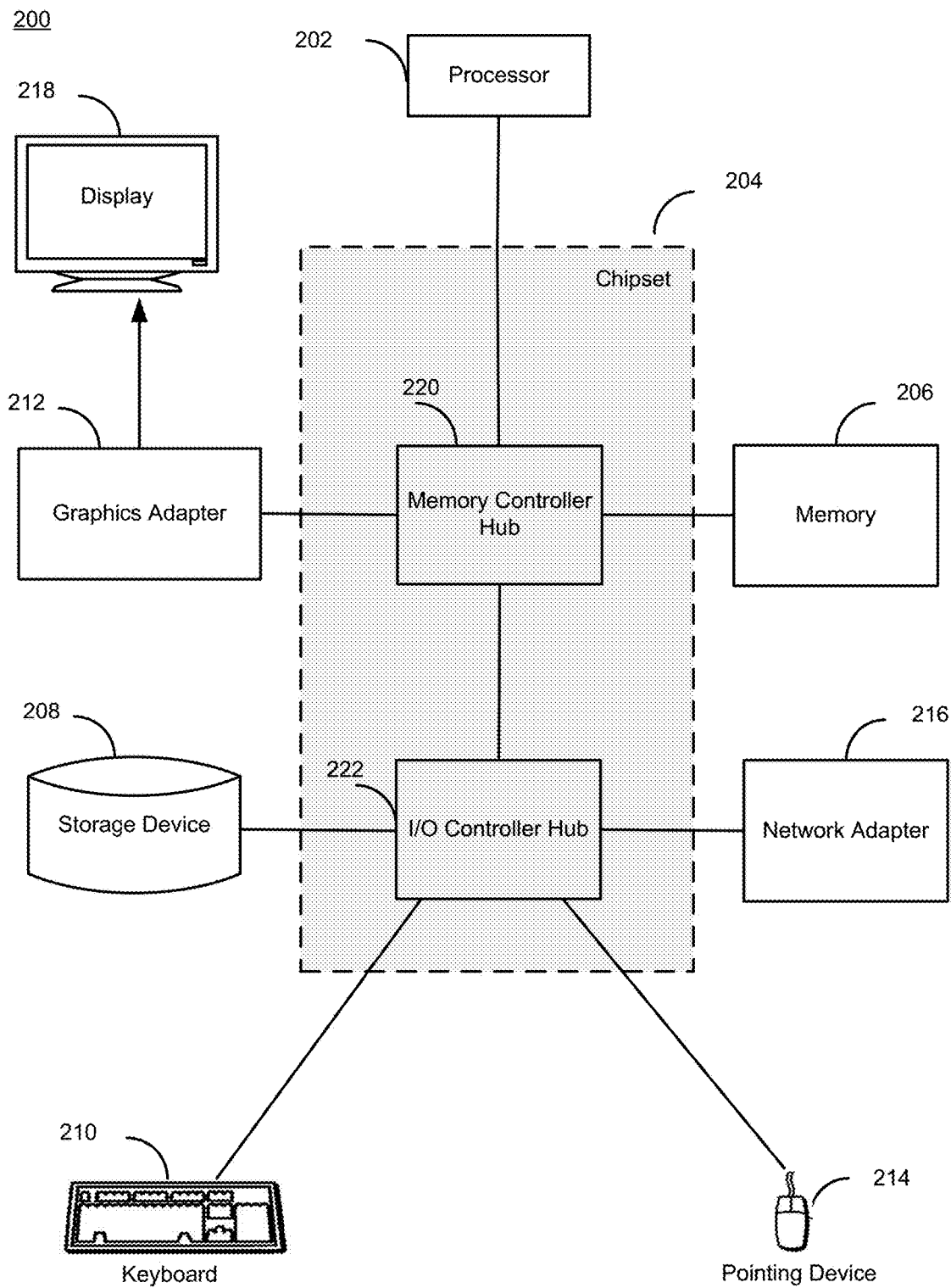
FIG. 2 is a high-level block diagram illustrating an example of a computing device for performing custom designing of a circuit, according to one embodiment.

The EDA software 112 may be implemented in one or more computing devices such as the computing device 200 of FIG. 2. For example, the EDA software 112 is stored as instructions in the computer-readable medium which are executed by a processor for performing operations 114-132 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 114, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 116, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 118, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 120, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 122, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 124, the placement (positioning of circuit elements) and routing (connection of the same) occurs. Example EDA software products from Synopsys, Inc. of Mountain View, Calif. that can be used at this stage include: Custom Compiler, the Astro® and IC Compiler® products. Embodiments described herein relate primarily to the physical implementation 124.

During analysis and extraction 126, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 128, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 130, geometric manipulations of the layout are performed to improve manufacturability of the design. Example EDA software products from Synopsys, Inc. of Mountain View, Calif. that can be used at this stage include: Proteus®, Proteus® AF, and PSMGED® products.

During mask-data preparation 132, the 'tape-out' data for production of masks to produce finished chips is provided. Example EDA software products from Synopsys, Inc. of Mountain View, Calif. that can be used at this stage include the CATS® family of products. Formal verification may be performed at the stage of logic design and functional verification 116. Low power design specification is typically processed during stages synthesis and design for test 118 or netlist verification 120.

Example Computing Device

FIG. 2 is a high-level block diagram illustrating an example of a computing device 200 for performing custom designing of a circuit, according to one embodiment. The computing device 200 includes at least one processor 202 coupled to a chipset 204. The chipset 204 includes a memory controller hub 220 and an input/output (I/O) controller hub 222. A memory 206 and a graphics adapter 212 are coupled to the memory controller hub 220, and a display 218 is coupled to the graphics adapter 212. A storage device 208, keyboard 210, pointing device 214, and network adapter 216 are coupled to the I/O controller hub 222. Other embodiments of the computing device 200 have different architectures.

The storage device 208 is a non-transitory computer-readable storage medium such as a hard drive, compact disk read-only memory (CD-ROM), DVD, or a solid-state memory device. The memory 206 holds instructions and data used by the processor 202. The pointing device 214 is a mouse, track ball, or other type of pointing device, and is used in combination with the keyboard 210 to input data into the computing device 200. The graphics adapter 212 displays images and other information on the display 218. The network adapter 216 couples the computing device 200 to one or more computer networks.

The computing device 200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 208, loaded into the memory 206, and executed by the processor 202. The types of computing devices 200 used can vary depending upon the embodiment and requirements. For example, a computing device may lack displays, keyboards, and/or other devices shown in FIG. 10.

The interactive routing system 300 described below in detail with reference to FIG. 3 below may be embodied by the computing device 200.

Interactive Routing System

Figure 3:
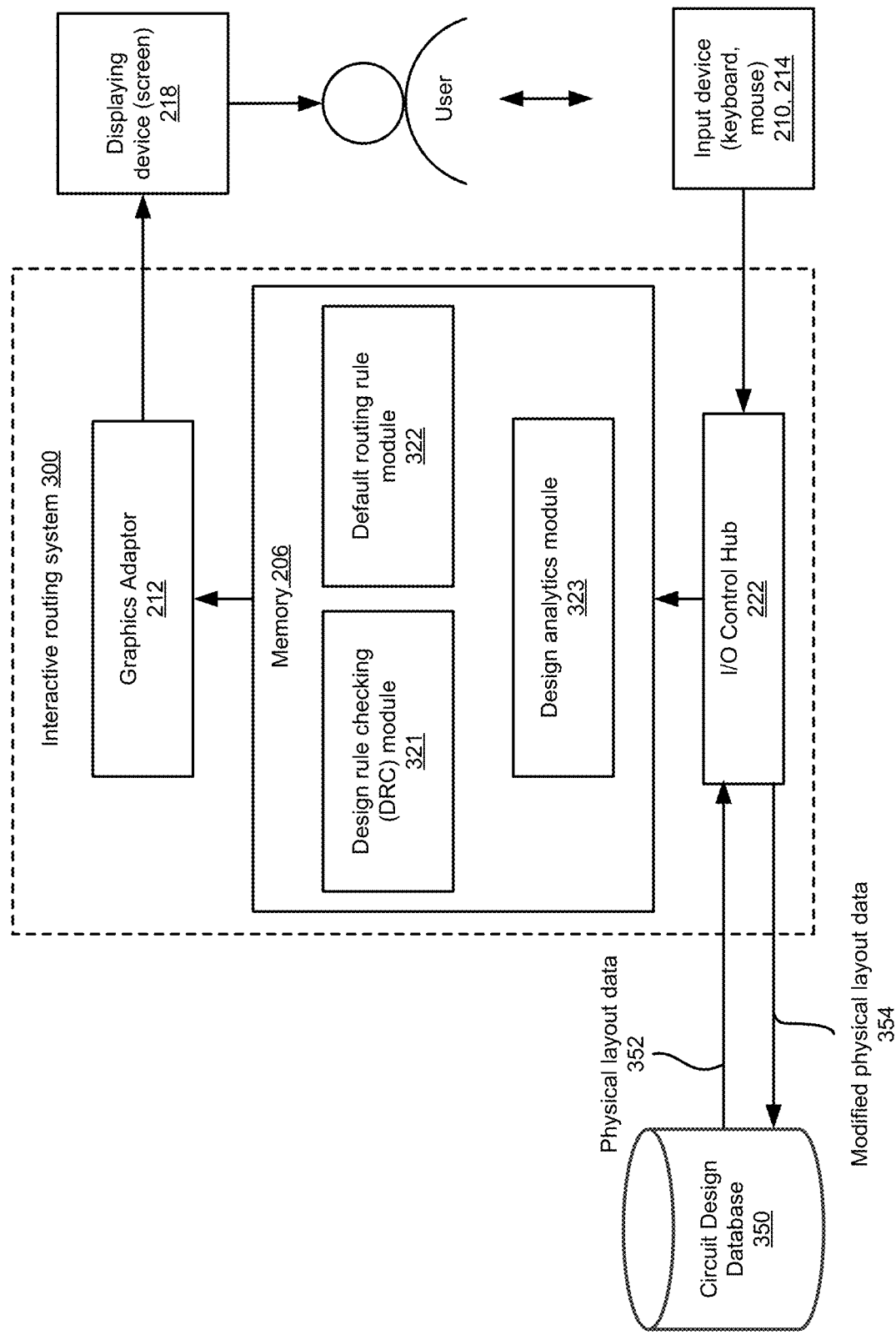
FIG. 3 is a block diagram illustrating an example interactive routing system, according to one embodiment.

FIG. 3 is a block diagram illustrating an example interactive routing system 300, according to one embodiment. The interactive routing system 300 performs the operation of routing connections of a circuit interactively displaying establishing or modification of connections as the user inputs are received instead of batch processing the connections after receiving a series of user inputs without intermediate displaying of connections.

The term "interactive" or "interactively", as used herein, refers to a feature of the routing system 300 that the displaying of connections is performed in real-time or near real-time as the user inputs are received. For example, after a first selection of a pin of a circuit element in the circuit (e.g., a first mouse click of the pin), the establishing or modification of the connections is displayed to a user in real-time based on the user's cursor movement by the user without a further selection of another pin of the circuit element (e.g., a mouse click of another pin).

For this purpose, the interactive routing system 300 communicates with a circuit design database 350 and interacts with a user via input devices 360 (e.g., keyboard, mouse) and output devices (e.g., displaying device 368). In one embodiment, the input devices 360 are the keyboard 210 and the pointing device 214 shown in FIG. 2, and the displaying device 368 is the display 218 shown in FIG. 2. The user inputs provided by the user via the input devices 210, 214 may instruct the interactive routing system 300 to establish or modify connections to or from a circuit element (e.g., FinFET) or between pins of a circuit element, and display such connections on the display 218.

The circuit design database 350 interacts with the interactive routing system 300 to provide physical layout data 352 and to receive modified physical layout data 354 from the interactive routing system 300. The physical layout data 352, as used herein, includes physical geometric layout of patterns, schematic-layout mapping information (hereinafter referred to as "the mapping information"), number of metal layers, and physical processes associated with fabricating the circuit.

The mapping information may indicate, among others, grouping of pins in one or more circuit elements into one or more subsets of pins, and correspondence of pins in the one or more circuit elements to other pins in the one or more circuit elements. When pins are indicated as being grouped to a subset of pins, a selection of an initial pin in a subset of pins to a trunk may subsequently result in selection of other intermediate pins in the same subset of pins while intermediate pins of other subsets of pins may be unselected, as described below in detail with reference to FIGS. 5A through 6B.

The modified physical layout data 354 is a version of the physical layout data that is modified relative to the original physical layout data 352 by the interactive routing system 300. The physical geometric layout of patterns is a digital representation of a circuit, for example, in GDSII format. The modified physical layout data 354 includes a physical geometric layout of patterns of routed connections not present in the physical geometric layout of patterns in the physical layout data 352. Additional information representing newly generated connections of the circuit may be included in modified physical layout data 354.

The circuit design database 350 may be embodied, for example, as OpenAccess database. Although the circuit design database 350 is described as being a component separate from the interactive routing system 300, the circuit design database 350 may be part of the interactive routing system 300. For example, the circuit design database 350 may be a module in memory 206.

The interactive routing system 300 may include, among other components, an I/O controller hub 222, a memory 206, and graphics adapter 212. The I/O controller hub 222 receives user input from the input device 360 as well as physical layout data from the circuit design database 350 external to the interactive routing system 300, processes the received user input as well as the received physical layout data, and provides the processed information to the memory 206.

The memory 206 may include, among other modules, a design rule checking (DRC) module 321, a default routing rule module 322, and a design analytics module 323. The memory 206 may include other software components (e.g., operating system) not illustrated in FIG. 3.

The DRC module 321 determines whether a physical layout of a particular chip satisfies a series of design rules. The design rules, as known in the art, refer to general parameters recommended by semiconductor manufacturers to ensure that proper integrated circuits can be manufactured by the semiconductor manufactures. When the design rules are violated, the DRC module 321 prompts the violation to the user for corrective actions or automatically modifies the physical layout to comply with the design rules.

The default routing rule module 322 stores default routing rules to be used in connecting pins and circuit elements. The default routing rule may include, for example, default routing patterns (e.g., fishbone type routing structure as shown in FIG. 5B or backbone type routing structure as shown in FIG. 5C) to be used and the use of fishbone/backbone type routing structure may be used as a default value and then updated per the user's choice. The fishbone and backbone type routing structures set by the default routing rule module 322 are described below in detail with reference to FIGS. 5B and 5C. The default routing rules as stored in the default routing rule module 322 may be changed by the user.

The design analytics module 323 performs automatic connection operations by replicating connections associated with a pin to connections of other pins. The design analytics module 323 may perform, among other, the following operations: (i) performs trunk type interactive routings based on user inputs associated with an initial pin of a circuit element, as described below in detail with FIGS. 5A and 5C, (ii) automatically replicate connections corresponding to an initial routing pattern specified by the user, as described below in detail with FIGS. 9A and 10B, (iii) automatically determine width and length for cloned pins, and (iv) change a routing connection (e.g., by mirroring the connection) when an obstacle is encountered in its path, as described below in more detail with reference to FIGS. 8A and 8B.

Example Connection Elements

Figure 4A:
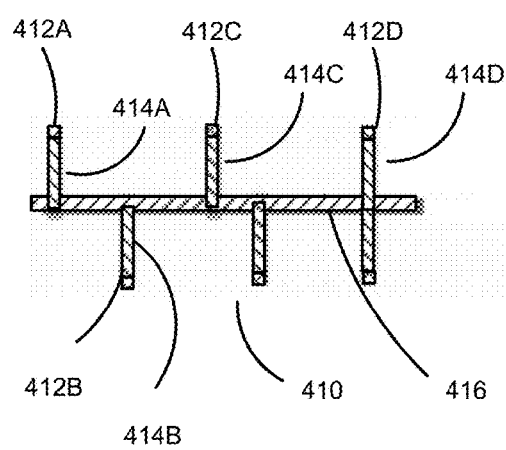
FIGS. 4A and 4B are diagrams illustrating various connection elements associated with one or more circuit elements for explanation purposes.
Figure 4B:
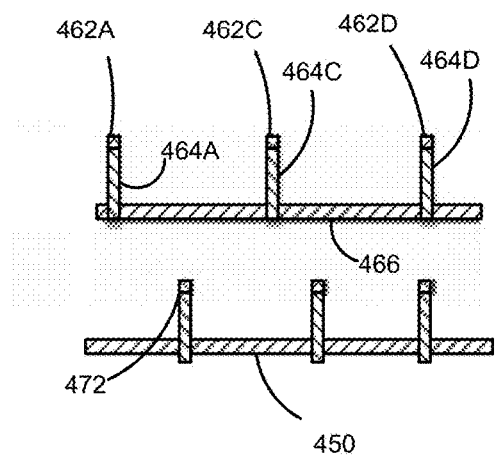

FIGS. 4A and 4B are diagrams illustrating various connection elements associated with one or more circuit elements for explanation purposes. More specifically, FIG. 4A illustrates various elements associated with two circuit elements with fishbone type routing structure 410. In FIG. 4A, the various elements with the fishbone type routing structure 410 include multiple pins 412A through 412D (collectively referred to as "pin 412"), multiple branches 414A through 414D (collectively referred to as "branch 414") corresponding to the multiple pins, and a trunk 416 connecting the pins via the branches. In more detail, for a fishbone type routing structure 410 as shown in FIG. 4A, the trunk 416 connects the branches 414 on both sides of the trunk each from a corresponding circuit element.

Pins 412 may be part of different circuit elements. For example, pin 412A is from a circuit element (complete representation not shown here) and is connected to the trunk 416 via a corresponding branch 414A on one side of the trunk, and pin 412B is from another circuit element (complete representation not shown here) and is connected to the trunk via a corresponding branch 414B on the other side of trunk. Alternatively, all pins 412 may be part of the same circuit element.

For the purpose of illustration, FIG. 4A shows merely one example fishbone type routing structure with routing connections between pins 412 and the trunk 416, and three pins 412 are connected to the trunk 416 via corresponding branches 414 on each side of the trunk. In alternative embodiments not shown, on each side of a trunk for a fishbone routing structure, a different number of pins and/or pins located in different positions can also be connected to the trunk.

In contrast, FIG. 4B illustrates various elements associated with one circuit element with backbone type routing structure 450. In FIG. 4B, the backbone type routing structure 450 includes multiple pins 462A through 462D (collectively referred to as "pins 462"), multiple branches 464A through 464D (collectively referred to as "branches 464") corresponding to the multiple pins 462, and a trunk 466 connecting the pins via the branches. In more detail, for a backbone type routing structure 450 as shown in FIG. 4B, the trunk 466 connects the branches 464 only on one side, and the connected pins are from one circuit element.

As shown in FIG. 4B, pins 462 included in the backbone type routing structure belong to a single circuit element. For example, pin 462A is from one circuit element (complete representation not shown here) and is connected to the trunk 466 via a corresponding branch 464A on one side and of the trunk, and pin 472 positioned on the other side of the trunk is not selected for connection with the trunk.

For purpose of illustration, FIG. 4B shows merely one example fishbone routing structure with routing connections between pins 462 and the trunk 466, and three pins 462 connected to the trunk 466 via corresponding branches 464 on one side (the upper side) of the trunk. In alternative embodiments (not shown), a different number of pins and/or pins located in different positions can also be connected to the trunk, and the pins for connection with the trunk can be the pins positioned on the other side (the bottom side).

Connections Using Auto Welding

Figure 5A:
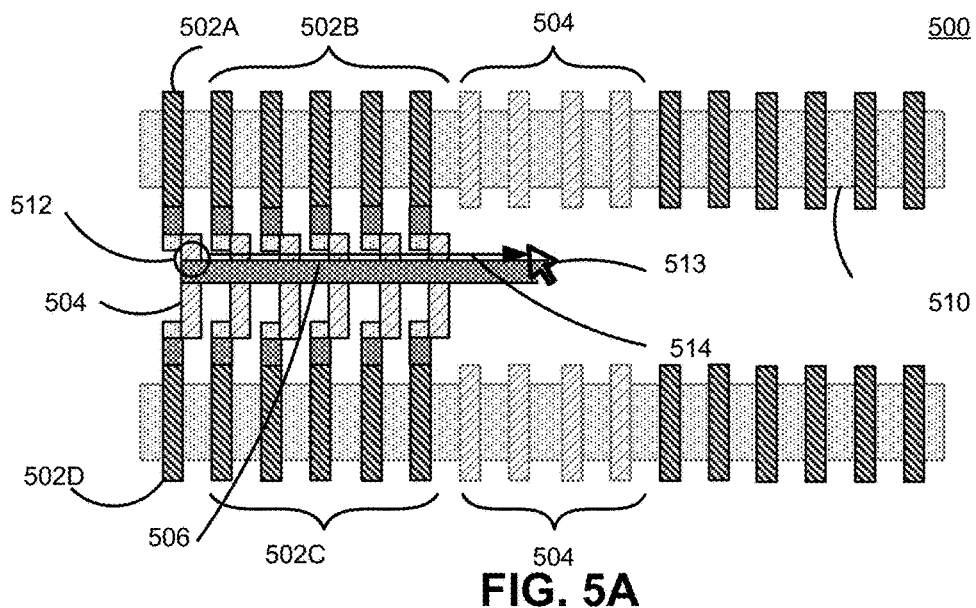
FIG. 5A is a diagram illustrating an example generation of routing connections on a circuit element by the interactive routing system based on user inputs, according to one embodiment.
Figure 5B:
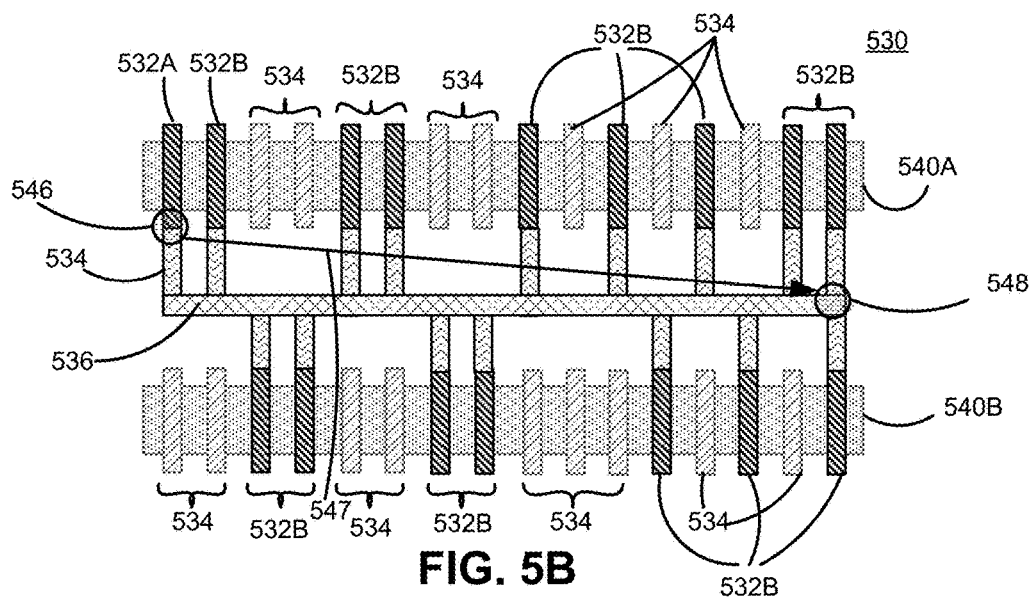
FIG. 5B is a diagram an example of generating routing connections on circuit elements corresponding to a fishbone type routing structure, according to one embodiment.
Figure 5C:
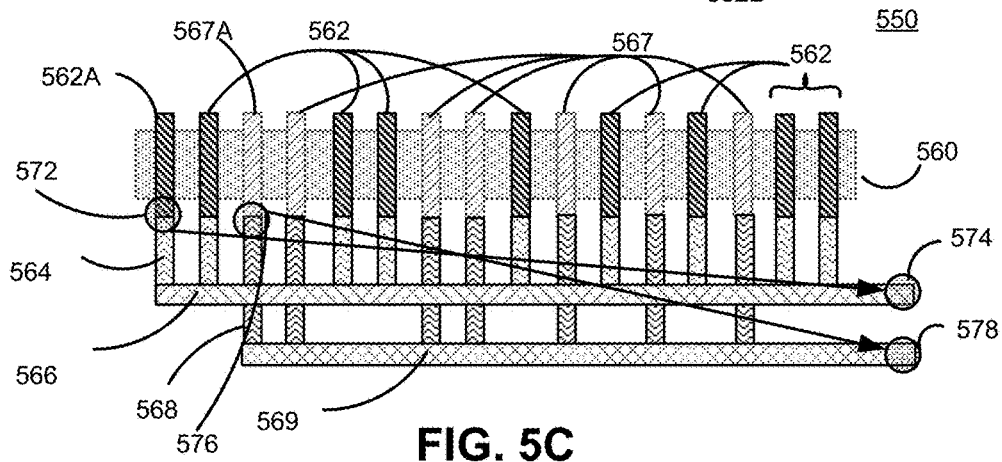
FIG. 5C is a diagram illustrating an example of generating routing connections on a circuit element corresponding to a backbone type routing structure, according to one embodiment.

FIG. 5A is a diagram illustrating an example of generating routing connections 500 on circuit elements 510 by the interactive routing system 300 based on user inputs, according to one embodiment. In FIG. 5A, two circuit elements 510 representing two rows of FinFETs are illustrated with a fishbone type routing structure, and each of them further includes multiple pins. In the examples of FIG. 5A, the pins of the FinFET rows are divided into two subsets, a first subset of pins 502 indicated by thicker lines and a second subset of pins 508 indicated by thinner lines. Such groupings of pins are indicated in the mapping information of physical layout data 352, as described above with reference to FIG. 3, and in one embodiment, the first subset of pins 502 are intended to be connected to a trunk 506 to form the routing connections 500, while the second subset of pins 508 are intended not to be connected to the trunk 506.

After receiving a first user input 512 representing selection of an initial pin 502A (shown by circle 512) in the first subset, initial pin 502A is first connected to the trunk via a branch 504. The first user input 512 may be a click on the initial pin 502A by the user. As a result of the first user input 512, the branch 504 extends in a direction forming an angle (e.g., 90 degrees) with respect to the lengthwise direction of the trunk 506, as shown in FIG. 5A.

As a subsequent user input (represented by arrow 514) is received, the trunk 506 gradually extends and intermediate pins 502B, 502C of the same subset as the initial pin 502A are connected with the trunk via corresponding branches 504 while the second subset of pins 508 belonging to the second subset of pins remain unconnected to the trunk 506. As one example, the subsequent user input 514 is a swiping movement causing the cursor to move long the lengthwise direction of the rows of FinFETs away from the initial pin 502A. As described above, the connections with intermediate pins 502B, 502C are formed by the subsequent user input 514 without receiving further user inputs on the intermediate pins 502B, 502C (e.g., mouse clicks on intermediate pins 502B, 502C). Such an operation of automatically connecting pins to a trunk not explicitly indicated by user inputs is referred to as "auto welding" herein.

The routing connections 500 shown in FIG. 5A is incomplete, which means that the routing connections is subject to further change based on movement of the cursor 513 or other user inputs. After a further user input (e.g., mouse click) is received, the routing connections are completed, as described below with reference to FIG. 5B.

FIG. 5B is a diagram illustrating an example of generating routing connections 530 on circuit elements 540A, 540B (hereinafter collectively referred to as circuit elements 540) corresponding to a fishbone type routing structure, according to one embodiment. The circuit elements 540A, 540B represent two FinFET rows. As in the example of FIG. 5A, the pins of the FinFET rows in FIG. 5B are divided into two subsets, a first subset of pins 532 indicated by thicker lines and a second subset of pins 538 indicated by thinner lines. Similar to FIG. 5A, the grouping of the first subset of pins 532 and second subset of pins 538 are indicated by the mapping information associated with the rows of FinFETs shown in FIG. 5B and the first subset of pins are intended to be connected to a trunk 536 to form the routing connections 530.

When a first user input (represented by circle 546) on the initial pin 532A is received by the interactive routing system 300, a corresponding branch 534 and a trunk 536 is generated and displayed. As a subsequent user input (represented by arrow 547) is received, the trunk 536 gradually extends and automatically forms connections between intermediate pins 532B in the same subset as the initial pin 532A and the trunk 536 via the branches 534. As one example, the subsequent user input is a swiping movement causing the cursor to move in a lengthwise direction of the rows of FinFETs.

When another user input (represented by circle 548) for an end pin 532C of the same subset as the initial pin 532A is received, the routing connections 530 are committed or finalized. There are two end pins 532C, one in the top FinFET row and the other in the bottom FinFET row. Selection of either of end pins 532C would result in the same connections as illustrated in FIG. 5B. As shown in FIG. 5B, only two clicks on the circuit element 540 and a swiping motion are needed to generate a design layout of routing connections 530. As a result of committing to or finalizing the end pin 523C by selecting the end pin 532C, the interactive routing system 300 stores the connections 530 as displayed in the circuit design database 350. The user input for selecting an end pin may include clicking of a pointing device (e.g., mouse), pressing a certain one or more keys on a keyboard or floating a cursor on a pin for more than a predetermined amount of time.

FIG. 5C is a diagram illustrating an example of generating routing connections 550 on a circuit element 560 corresponding to a backbone type routing structure, according to one embodiment. The routing connections 550 are generated by the interactive routing system 300 based on user inputs of a user. In FIG. 5C, the circuit element 560 represents a single row of FinFETs. As in the example of FIGS. 5A and 5B, the pins of the FinFET rows in FIG. 5C are divided into two subsets, a first subset of pins 562 indicated by thicker lines and a second subset of pins 567 indicated by thinner lines. Similar to FIGS. 5A-5B, the grouping of the first subset of pins 562 and second subset of pins 567 are indicated by the mapping information associated with the rows of FinFETs shown in FIG. 5C and the first subset of pins are intended to be connected to a trunk 536 to form the routing connections 550.

When a first user input (represented by circle 572) is received by the interactive routing system 300, a corresponding branch 564 extending from a first initial pin 562A and a trunk 566 are generated and displayed. When a subsequent user input (e.g., representing a cursor movement along with the lengthwise direction of the circuit element 560 and away from the first initial pin 562A) is received, the trunk 566 gradually extends and connections between pins 562 in the same subset as the first initial pin 562A and the trunk 566 via the branches 564 are automatically generated while the other subset of pins 567 remain unconnected. With another user input (represented by circle 574), the end pin 562C is selected and the routing connections of the first trunk 566 and the first group of pins 562 in the first subset via the branches 564 are completed.

Similar to the first trunk 566, the routing connections associated with the second trunk 569 and the second subset of pins 567 via branches 568 are displayed when a user input (represented by circle 576) on a second initial pin 567A, a subsequent user input (representing a cursor movement along the lengthwise direction of the FinFET row) and a last user input (represented by circle 578) are received. The last user input indicates selection of pin 567C as the end pin for the operation initiated by selecting the second initial pin 567A. As shown in FIG. 5C, only four clicks and two swiping motions are needed to complete connections of pins in the row of FinFETs.

Figure 6A:
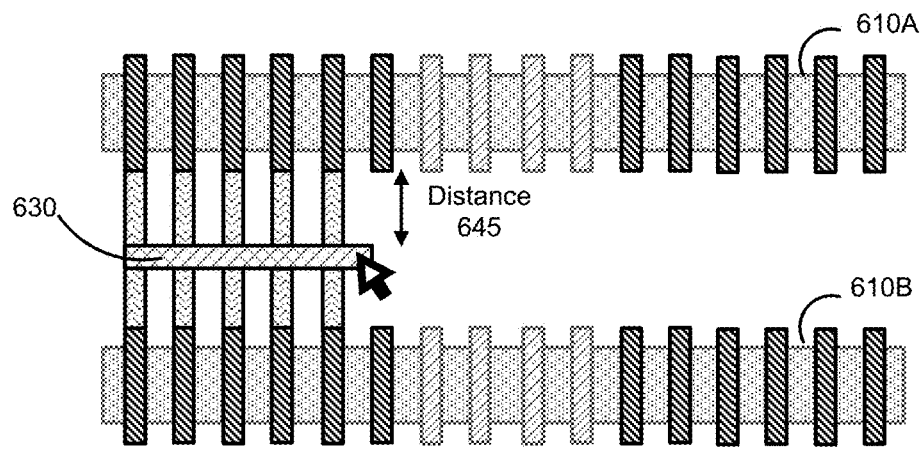
FIGS. 6A and 6B are diagrams illustrating examples of different positions of a trunk between two circuit elements in a circuit layout based on different user inputs, according to one embodiment.
Figure 6B:
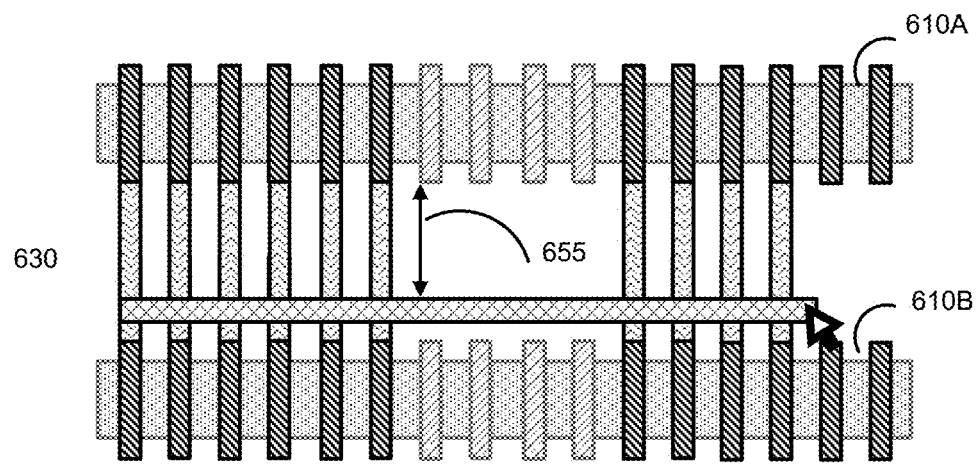

Different connections may be formed based on the same physical layout data despite selecting of the same initial pin and end pin when different the subsequent user input after the selection of the initial pin represent a different path. For example, the positions of the trunks may be changed based on the subsequent user input as illustrated in FIGS. 6A and 6B. The routing connections shown in FIGS. 6A and 6B have a fishbone routing structure and two circuit elements (e.g., two transistor rows) are displayed. As shown in FIGS. 6A and 6B, the distance between the first circuit element 610A and the trunk 630 can vary based on whether the subsequent user input represented movement of the cursor along path 622 or path 624. More specifically, the distance 645 shown in FIG. 6A is shorter than the distance 655 shown in FIG. 6B. Similar changes in the distance to the trunk may be implemented in a backbone routing structure layout.

Connections Using Auto Cloning

Figure 7A:
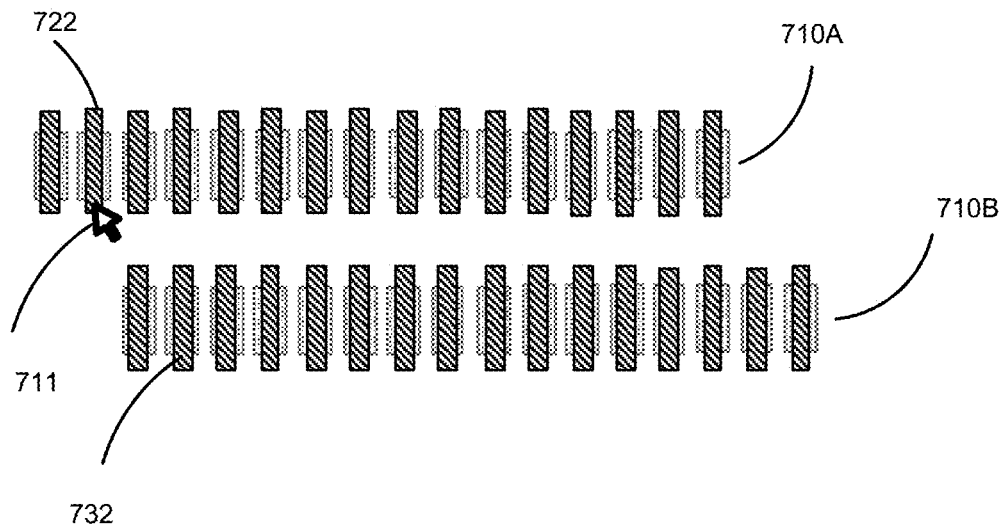
FIGS. 7A and 7B are diagrams illustrating an example of automatically cloning routing connections by the interactive routing system, according to one embodiment.
Figure 7B:
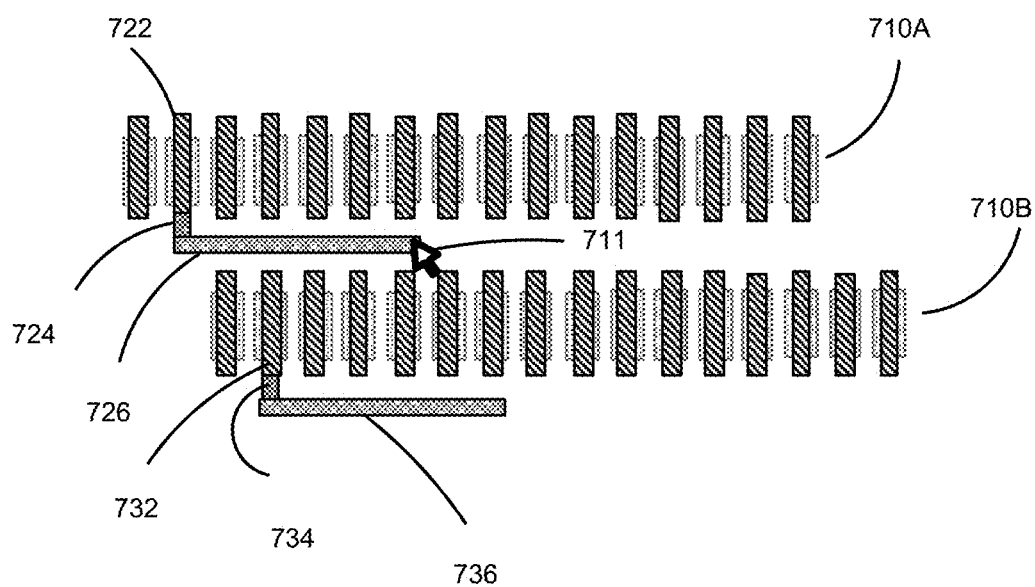

FIGS. 7A and 7B are diagrams illustrating an example of automatically cloning connections by the interactive routing system 300, according to one embodiment. FIG. 7A shows two rows of FinFETs 710A and 710B while FIG. 7B shows connections for FinFETs 710B being replicated automatically as user inputs are received for establishing connections for FinFETS 710A. Relationships between pins of the FinFETs 710A and pins of FinFETs 710B are indicated by the mapping information, as described above with reference to FIG. 3. In the embodiments of FIGS. 7A and 7B, it is assumed that the mapping information indicates that nth pin in the row of FinFETs 710A is mapped to nth pin in the row of FinFETs 710B.

When the interactive routing system 300 receives a first user input representing selection of an initial pin 722 (e.g., a click on an initial pin 722 of a cursor 711 operated by the user), a mapped pin 732 in the second circuit element 710B is also selected by the interactive routing system 300. Thereafter, any connections established in relation to the initial pin 722 are replicated for connections associated with the mapped pin 732. The connections that are replicated are referred to "replicated connections", "replicated routing connections", "cloned connections" or "cloned routing connections" throughout the specification. Such an operation of replicating connections based on mapping of pins without specific user selection (e.g., mouse click) of those connections is referred to as "auto cloning" herein.

That is, after the first user input (e.g., the click on the initial pin 722) on the circuit element 710A is received, the initial branch 724 and a corresponding trunk 726 (also referred to as an initial trunk) are generated and displayed simultaneously with a replicated branch 734 corresponding to the initial branch 724 and a replicated trunk 736 corresponding to the initial trunk 726. As a subsequent user input (representing a horizontal cursor movement away from the initial pin 722 in the left direction) is received, the initial trunk 726 and the replicated trunk 736 are extended to the right simultaneously.

Figure 8A:
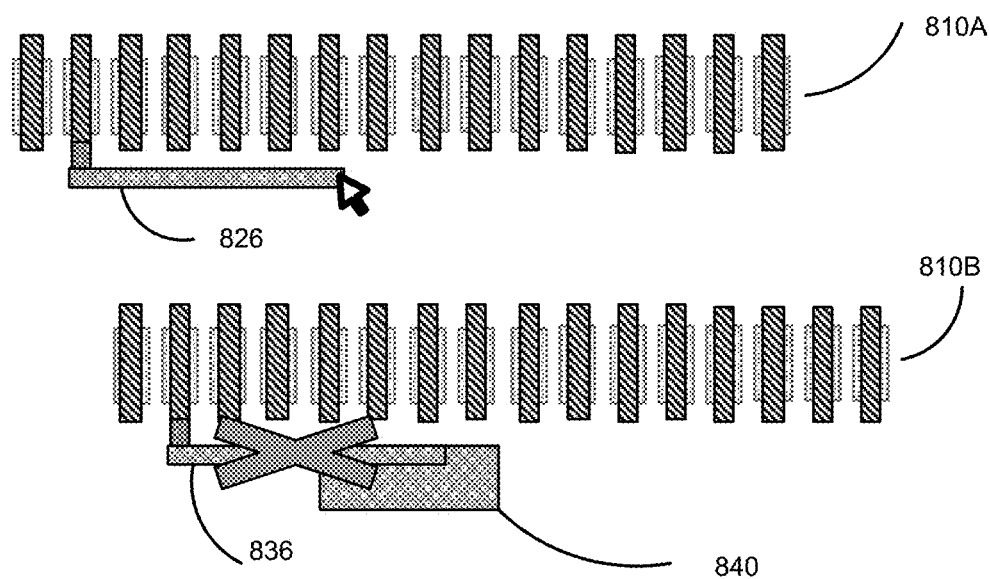
FIGS. 8A and 8B are diagrams illustrating an example of mirroring a replicated connection from a circuit element when a routing obstruction is encountered in the path of the replicated connection, according to one embodiment.
Figure 8B:
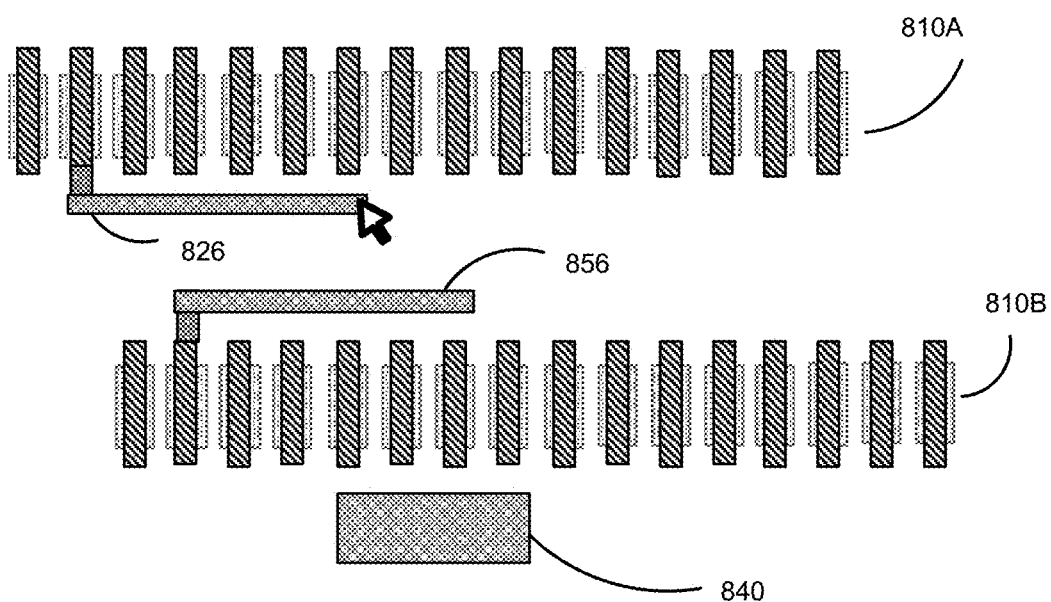

FIGS. 8A and 8B are diagrams illustrating an example of mirroring a replicated connection from a circuit element when a routing obstruction is encountered in the path of the replicated connection, according to one embodiment. FIG. 8A shows an example of circuit elements 810A and 810B with a routing obstruction 840 interfering with planned replicated connection, according to one embodiment. As described above with reference to FIGS. 7A and 7B, the routing connections associated with circuit element 810A and replicated connections associated with circuit element 810B are generated based on user inputs. However, in FIG. 8A a routing obstruction 840 is present in the path of the replicated trunk 836. Example routing obstructions can be another circuit element or some other connections. The design analytics module 323 detects such obstruction and automatically takes corrective measure as described below in FIG. 8B.

FIG. 8B shows an example of mirrored cloning by the interactive routing system 300 in response to detecting the routing obstruction 840, according to one embodiment. As shown in FIG. 8B, after the design analytics module 323 detects the routing obstruction 840 interfering with the planned replicated trunk 836, the design analytics module 323 flips the location of the replicated branch 856 relative to the horizontal axis of the circuit element 810B. The flipped version is also referred to a "mirrored clone" of routing connections of the circuit element 810A.

FIGS. 8A and 8B show merely one example of routing obstruction and one example of real-time analysis and response (e.g., mirrored cloning) by the interactive routing system 300, and in alternative embodiments not shown, other types of corrective measures may be taken by the interactive routing system when a routing obstruction is encountered.

Figure 9A:
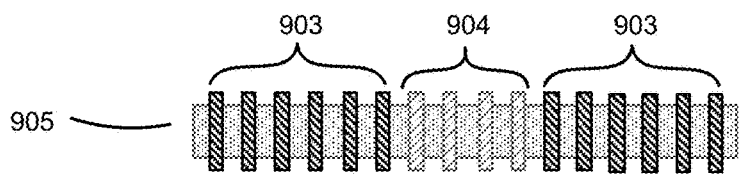
FIGS. 9A through 9H are diagrams illustrating a circuit element and different cloned routing connections of the circuit element that are established in accordance with receiving of user inputs, according to one embodiment.

FIGS. 9A through 9H are diagrams illustrating a circuit element and different cloned routing connections of the circuit element that are established in accordance with receiving of different user inputs, according to one embodiment. FIGS. 9A through 9H also show the different cloned connections of the circuit element are generated and displayed interactively. More specifically, FIG. 9A shows a row of FinFETs 905 before cloned routing connections are generated, and FIGS. 9B through 9H show multiple examples 920 through 980 of cloned routing connections based on different user inputs, according to various embodiments. The row of FinFETs 905 includes a first subset of pins 903 and a second subset of pins 904, grouping of which is indicated by the mapping information associated with the row of FinFETs 905.

Examples 920 through 980 shown in FIGS. 9B through 9H illustrate different cloned connections based on different user input (e.g., initial connections specified by a user). For the purpose of illustration, the term "initial connections," as used herein, refer to connections specified by the user based on the user's input (e.g., click on an initial pin, and cursor movement away from the initial pin). The initial connections include, for example, an initial trunk and branches connecting the trunk and corresponding pins. The term "cloned connections," as used herein refer to cloned connections automatically generated by the interactive routing system 300. The cloned connections include, for example, a replicated trunk and replicated branches connecting corresponding pins and the replicated trunk. In one embodiment, in each of FIGS. 9B through 9H, only one mouse click is used for selecting the initial pin of the corresponding circuit element, and the cloned connections are performed and displayed without a further mouse click used for selecting an end pin, which shows the cloned connections are generated interactively based on real-time user inputs (e.g., cursor movement). Until an end pin corresponding to the initial pin is selected, the initial connections and the cloned connections can change pursuant to the real-time user inputs. After an end pin is selected, the initial connections and the cloned connections are committed to, and the interactive routing system 300 stores them in the circuit design database 350.

Figure 9B:
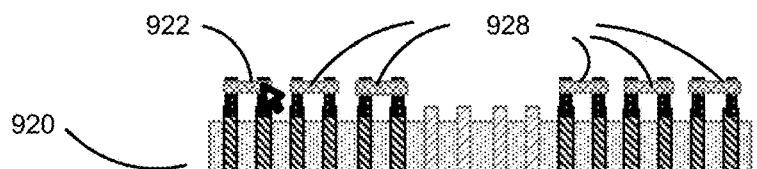

In more detail, example 920 illustrated in FIG. 9B shows an initial connection 922 specified by a user input (e.g., click and cursor movement), and multiple replicated connections 928. More specifically, the initial connection 922 is across two adjacent pins, and there are five replicated connections 928 on the same row of FinFETs where the initial connection is generated.

Figure 9C:
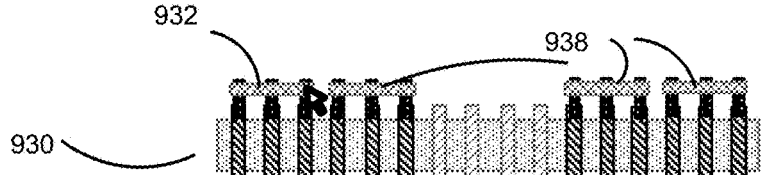

Example 930 illustrated in FIG. 9C shows another initial connection 932 specified by another user input (e.g., click and cursor movement), and multiple replicated connections 938. More specifically, the initial connection 932 is across three consecutive pins, and there are three replicated connections 938 on the same circuit element where the initial connection is generated.

Figure 9D:
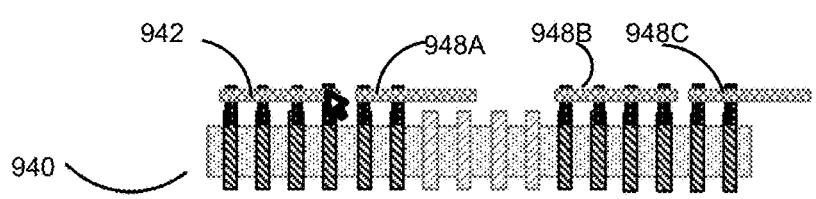

Example 940 illustrated in FIG. 9D shows another initial connection 942 specified by another user input (e.g., click and cursor movement), and multiple replicated connections 948. More specifically, the initial connection 942 is across four consecutive pins, and there are three replicated connections 948A through 948C on the same circuit element where the initial connection 942 is generated. Among the three replicated connections 948A through 948C, the first and the third replicated connections 948A and 948C each span across only two pins due to inadequate number of pins of the first subset, and the length of trunks in these two replicated connections 948A and 949C have the same length at the trunk of the initial connection 942. In contrast, with adequate pins, the second replicated connection 948B has the same length and configuration as the initial connection 942.

Figure 9E:
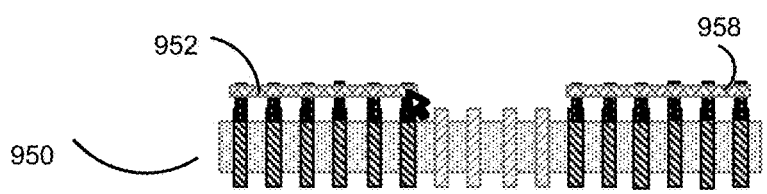

Example 950 illustrated in FIG. 9E shows another initial connection 952 specified by another user input (e.g., click and cursor movement), and one replicated connection 958. More specifically, the initial connection 942 is across five consecutive pins, and due to the absence of further pins of the first subset, only one replicated connection 958 is generated and the replicated connection is across all of the five pins of the first subset that remain, and the length of the trunk in the replicated connection 958 is the same as the length of the trunk of the initial connection 952.

Figure 9F:
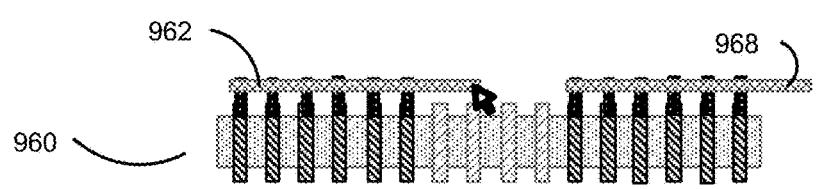

Example 960 illustrated in FIG. 9F shows another initial connection 962 specified by user input (e.g., click and cursor movement), and one replicated connection 968. Similar to example 950, the initial connection 962 is also across five consecutive pins, and due to absence of pins of the first subset, only one replicated connection 958 is generated and the replicated connection is across all of the five pins of the first subset that remain. Example 960 is different from example 950 in that the lengths of trunks in the initial connection 962 and the replicated connection 968 are longer than the length of trunks in the connections 952 and 958 due to further cursor movement.

Figure 9G:

Example 970 illustrated in FIG. 9G shows another initial connection 972 specified by another user input (e.g., click and cursor movement), and one replicated connection 978. More specifically, the initial connection 972 also span across six consecutive pins with the first five pins of the first subset being consecutive and the sixth pin of the first subset separated from the first five by the pins of the second subset in between. Also, due to absence of further pins of the first subset in the circuit element 905, only one replicated connection 978 spans across all of the remaining five pins of the first subset, and the lengths of the trunk in the replicated connection 978 and the initial connection 972 are the same.

Figure 9H:
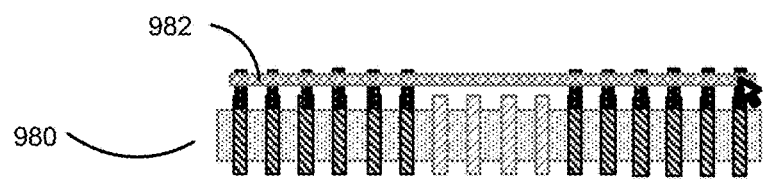

Example 980 illustrated in FIG. 9H shows another initial connection 982 specified by user input (e.g., click and cursor movement), with no replicated connection being generated.

More specifically, the initial connection 982 spans across twelve pins with the first six pins of the first subset being consecutive and the last six pin of the first subset separated from the first six by the pins of the second subset in between. Also, due to inadequate number of pins of the first subset, no replicated connection 978 is capable of being generated in the same circuit element.

During the routing process using interactive routing system 300, the initial connection and the replicated connection are gradually updated as shown in FIGS. 9A through 9H as the user input is received. As the cursor moves to different horizontal locations, the initial connection and the replicated connection are modified and displayed in real time to the user. Hence, the user can intuitively and more efficiently design the connections as intended.

FIGS. 10A and 10B are diagrams illustrating different examples of routing connections generated by the interactive routing system 300 based on different user inputs after selection of an initial pin and before selection of a second pin of a circuit element, according to one embodiment. Both FIG. 10A and FIG. 10B illustrate four rows of FinFETs 1005 through 1008, among which the rows of FinFETs 1005 and 1006 are original circuit elements manipulated by user via a cursor, and the rows of FinFETs 1007 and 1008 are circuit elements for which cloned connections are generated according to the routing connections of the original circuit elements 1005, 1006. As in the example of FIGS. 9A through 9H, the rows of FinFETs 1005-1008 have a first subset of pins 1012 and a second subset of pins 1013.

More specifically, in FIG. 10A, when a first user input 1025 (e.g., a click on an initial pin 1012A) is received, branches 1014 corresponding to an initial pin 1012A and other pins 1012B of the first subset as well as a trunk 1016 connected with the first subset of pins via the branches 1014 are generated and displayed. At the same time, for the row of FinFETs 1007, a pin 1032 mapped to the initial pin 1012A and replicated connections including replicated branches 1044 as well as replicated trunk 1046 are automatically generated and displayed by the interactive routing system in real time.

Similarly, as a subsequent user input representing cursor movement away from the branch 1014 and along path 1021 is received, the routing connections including six pins of the row of FinFETs 1005 are generated and displayed, while at the same time, the replicated connections for the row of FinFETs 1007, including six pins of the first subset are automatically generated and displayed by the interactive routing system 300. In FIG. 10A, connections to the circuit elements 1006 and 1008 are not generated.

In FIG. 10B, for the same four circuit elements 1005 through 1008 having pins 1012 of a first subset and pins 1013 of a second subset as the circuit elements in FIG. 10A, the routing connections span across circuit elements 1005 and 1006 when user inputs indicate pulling down the cursor below the circuit element 1006. More specifically, after the first user input 1065 (e.g., a click on an initial pin 1012A) is received, the subsequent user input represents a cursor movement along path 1023 first away from the initial pin 1012A through the branch 1054 and through the pin 1012B in the circuit element 1006, and then away from the pin 1012B along with the lengthwise direction of the circuit element 1006. As a result, a trunk 1056 is formed below the circuit element 1006. FIG. 10B shows the routing connections specified by user inputs is across two circuit elements 1005 and 1006.

In response to the routing connections specified by user inputs, at the same time, cloned connections that are across circuit elements 1007 and 1008 are automatically generated and displayed by the interactive routing system 300 in real time. In more detail, a pin 1072 mapped to the initial pin 1012A in the circuit element 1005 is automatically selected, and replicated branches 1074 corresponding to the branch 1054 as well as replicated trunk 1076 corresponding to the trunk 1056 are automatically generated and displayed in real time.

As described above with reference to FIGS. 10A and 10B, the same group of circuit elements (e.g., circuit elements 1005 through 1008) may be connected through different routing configuration by changing the path taken before selecting an end pin. Such different configurations may be displayed in real time as the cursor is moved to facilitate the operations associated with routing connections.

Figure 11A:
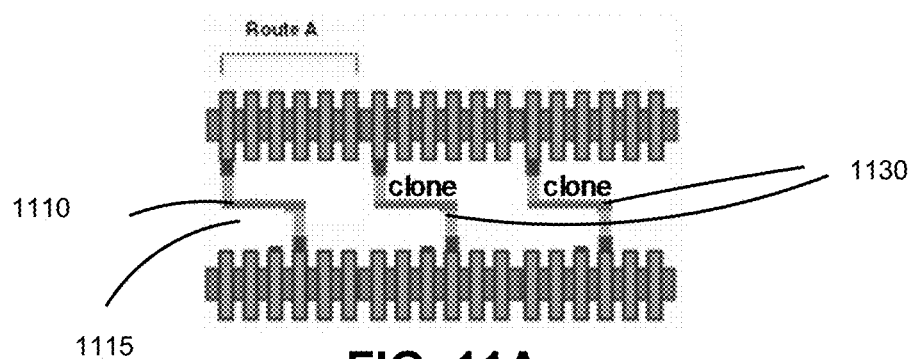
FIGS. 11A through 11C are diagrams illustrating different examples of connections cloned by the interactive routing system from a connection routed by a user, according to one embodiment.
Figure 11B:
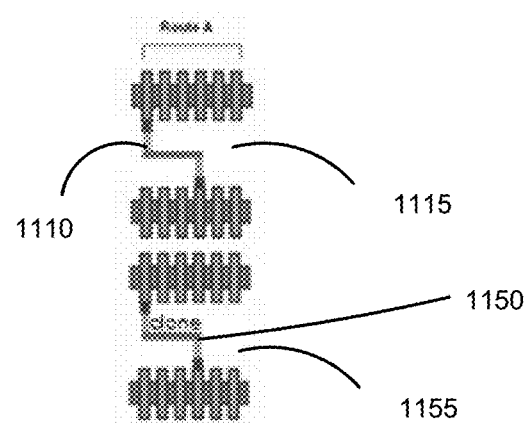
Figure 11C:
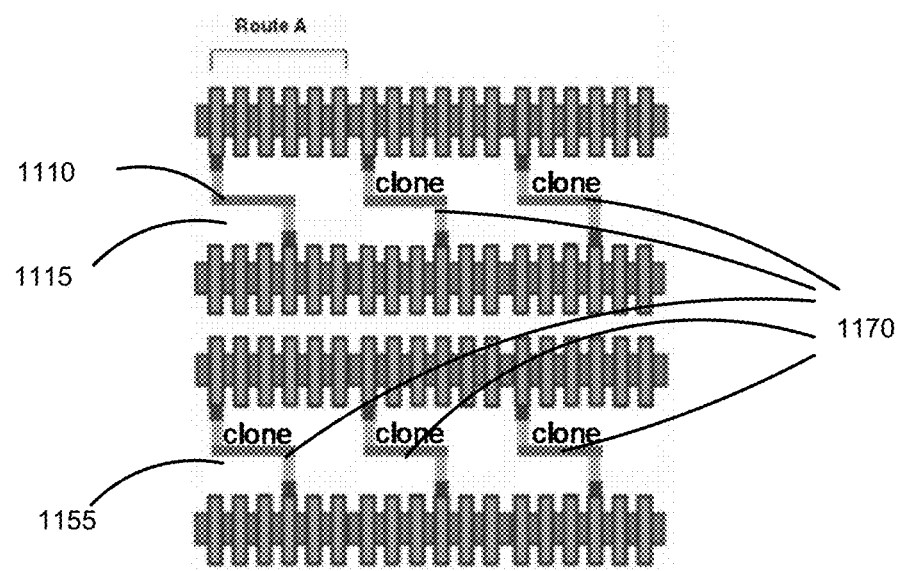

FIGS. 11A through 11C are diagrams illustrating different examples of connections cloned by the interactive routing system 300 from a connection routed by a user, according to one embodiment. The initial connection 1110 illustrated in FIGS. 11A-11C is specified by user inputs (not shown) and generated as well as displayed by the interactive routing system 300.

FIG. 11A shows an auto cloning configuration in which two cloned connections 1130 are generated between different rows of FinFETs, according to one embodiment. The mapping information used in FIG. 11A indicates mapping of a nth pin of each row of the FinFETs to (n+6 m)th pins of each row of the FinFETs, where m and n are integers. Hence, the selection of the first pin in the upper row of FinFETs as the initial pin results in the selection of 7th pin and 13th pin in the upper row of FinFETs as initial pins for the cloned connections, and the selection of fourth pin in the lower row of FinFETs as the end pin results in the selection of 10th pin and 16th pin of the lower row of FinFETs as ending pins for the cloned connections.

FIG. 11B shows an auto cloning in which one cloned connection 1150 is generated in between another pair of FinFET rows that are different from the pair of FinFET rows having the initial connection 1110, according to one embodiment. The generation of initial connection 1100 causes a cloned connection 1150 to be generated. The mapping information used in FIG. 11B indicates mapping of pins of four rows of FinFETs with the cloned connections in a different pair of elements as the connections routed by the user. More specifically, a nth pin in a mth row of FinFETs is mapped to a nth pin in a (m+3)th row of FinFETs, where m and n represent integers.

FIG. 11C shows an auto cloning in which five cloned connections 1170 are generated between multiple pins and multiple rows of FinFETs, according to one embodiment. The mapping information used in FIG. 11C indicates mapping of a nth pin of a i-th row of FinFETs to (n+6 m)th pins of the i-th row of FinFETs as well nth pin and (n+6 m)th pins of the (i+2)th row of FinFETs, where m, n and i represent integers.

FIGS. 11A through 11C show merely three examples of different auto configurations based on the same initial connection 1110 specified by a user, and in alternative embodiments not shown, other auto configuration based on the initial connection 1110 may be illustrated, and as one example, cloned connections are generated and displayed.

Multi-Level Connections

Figure 12A:
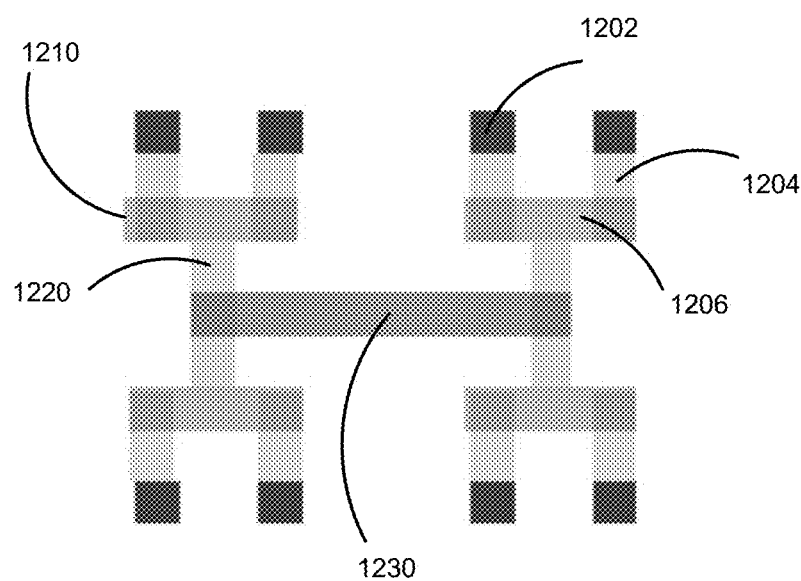
FIG. 12A is a diagram illustrating an example of multiple-level connections routed to or from a circuit element by the interactive routing system, according to one embodiment.

FIG. 12A is a diagram illustrating an example of multiple-level connections routed to or from a circuit element in a circuit by the interactive routing system, according to one embodiment. The multiple connections described herein refer to a hierarchical set of connections in the circuit with at least a plurality of first-level connections between pins of one or more circuit elements and at least one second-level connection that connects at least a subset of the plurality of first-level connections.

In FIG. 12A, first-level connections 1210, second-level connections 1220 generated on top of the first-level connections 1210, and a third-level connection 1230 generated on top of the second-level connection 1220 are illustrated. After the first-level connections 1210 are generated to provide connections between pins P, the first level connections then become a basis for forming the second-level connections 1220.

Similarly, after the second-level connections 1220 are generated, the second-level connections are used as a basis for generating the third-level connection 1230. In more detail, as one example, the first-level connections 1210 can be trunks connected to pins 1202 via branches, the second-level connections 1220 is connections bridging two first-level connections 1210, and the third-level connection 1230 is another connection bridging two second-level connections 1220.

Figure 12B:
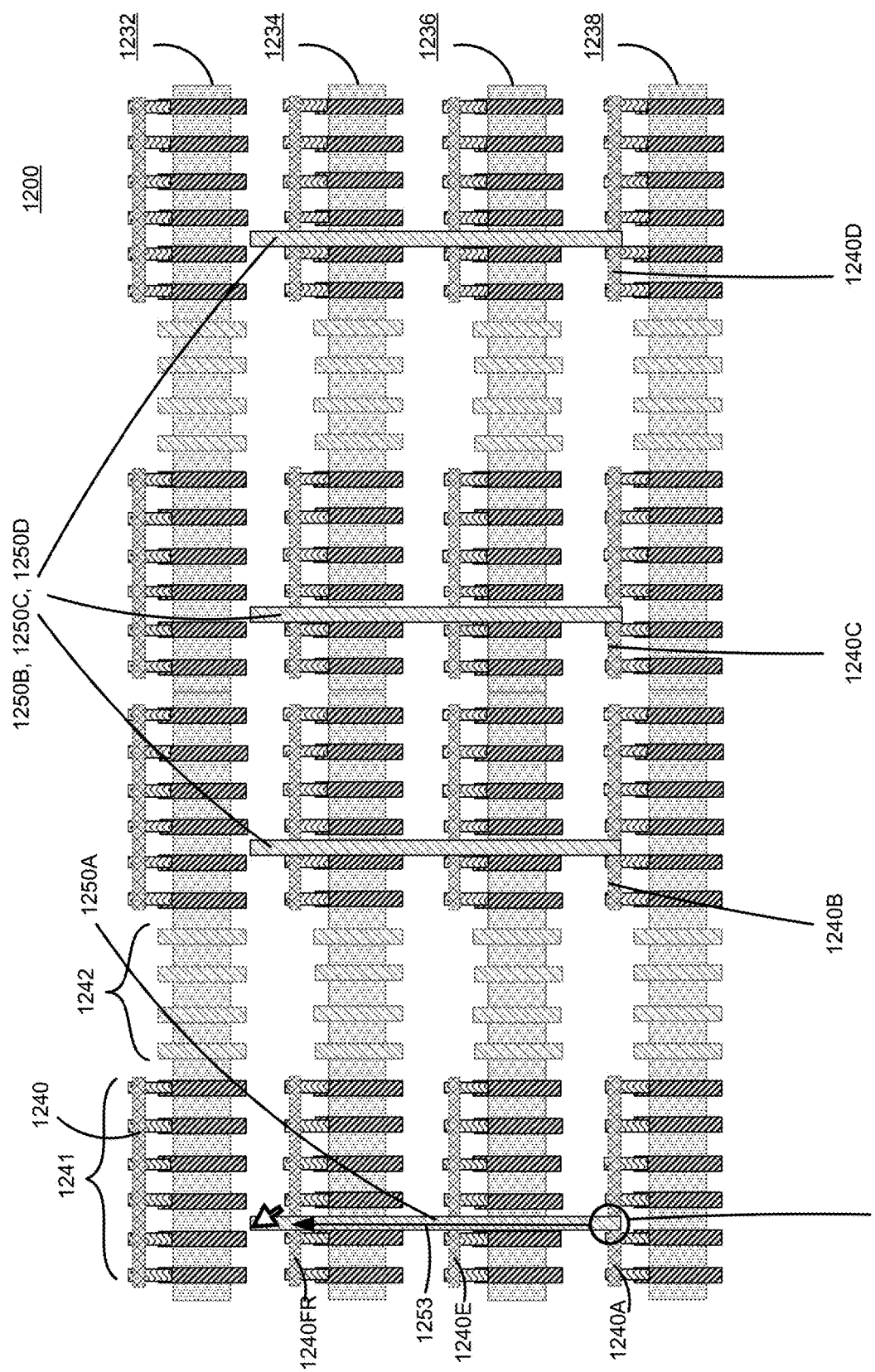
FIGS. 12B and 12C are diagrams illustrating different examples of multiple levels of connections routed to or from a circuit element by the interactive routing tool, according to one embodiment.
Figure 12C:
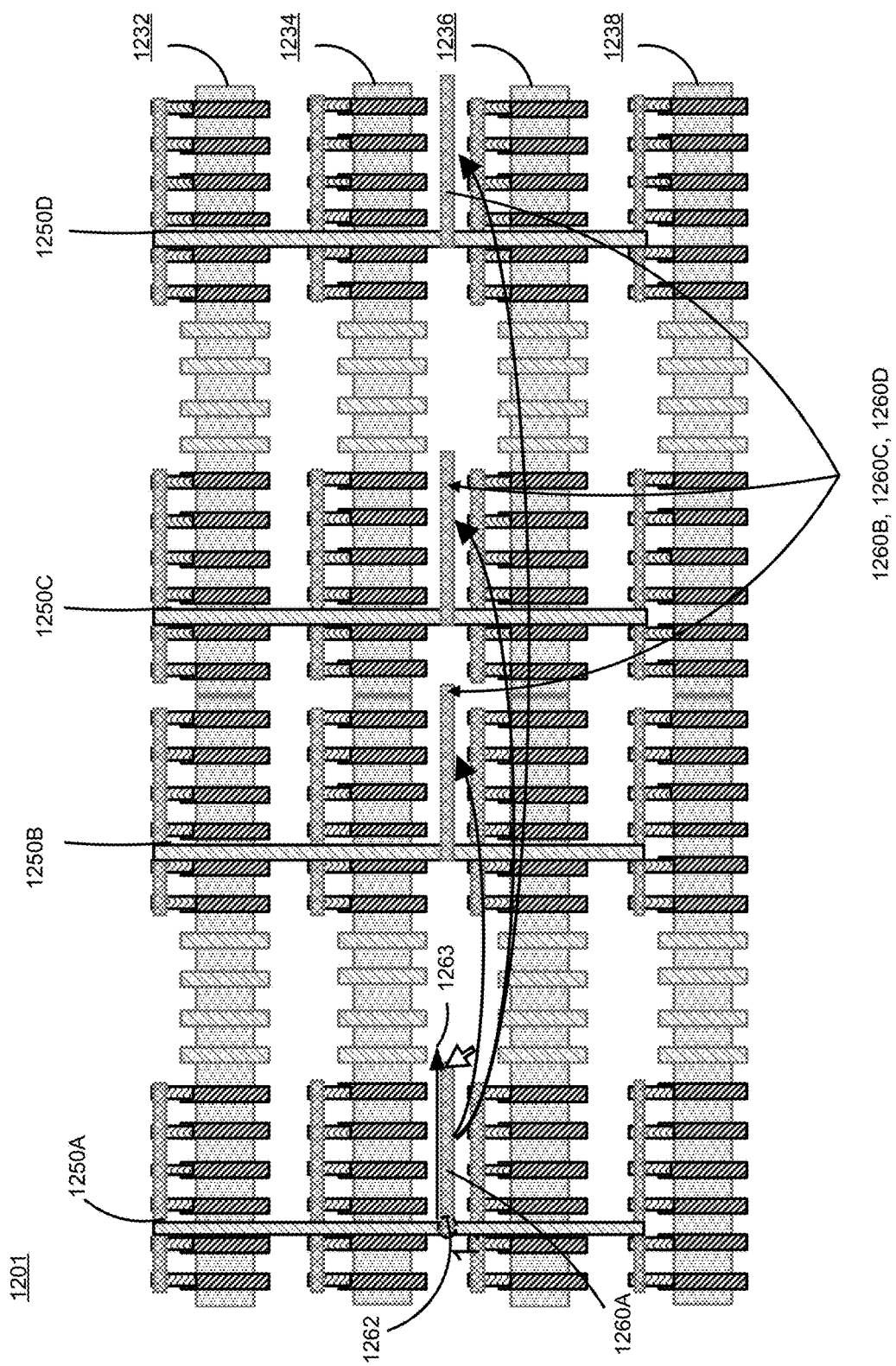

FIGS. 12B and 12C are diagrams illustrating different examples of multiple levels of connections routed to or from a circuit element in a circuit by the interactive routing system 300, according to one embodiment. More specifically, FIGS. 12B and 12C show examples of auto cloning configurations 1200, 1201 of second-level connections 1250 and third-level connections 1260 based on first-level connections 1240, according to one embodiment.

Both FIG. 12B and FIG. 12C show an auto cloning configuration 1200 including multiple rows of FinFETs 1232, 1234, 1236 and 1238 (e.g., transistor rows), each of which further includes pins 1241, 1242 grouped into different subsets for connection. In both FIG. 12B and FIG. 12C, the first-level connections 1240 may include initial connections 1240A specified by user inputs and cloned connections 1240B, 1240C, and 1240D automatically generated by the interactive routing system 300. In FIG. 12B, the second-level connections 1250 include an initial second-level connection 1250A specified by user inputs. That is, after a first user input represented by circle 1252 (e.g., a click on a selected first-level connection 1240A) is received, first-level connections 1240B through 1240D mapped to the initial first-level connection 1240A are automatically selected by the interactive routing system 300. As a subsequent user input representing upward cursor movement (represented by arrow 1253) is received, the initial second-level connection 1250A is extended across three first-level connections 1240A, 1240E, and 1240F, and the initial second-level connection connects the three first-level connections. At the same time, three cloned second-level connections 1250B through 1250D corresponding to the mapped first-level connections 1240B through 1240D are automatically generated and displayed in real time by the interactive routing system 300, and each of the cloned second-level connections connects a corresponding set of first-level connections.

In FIG. 12C, the third-level connections 1260 include an initial third-level connection 1260A specified by user inputs. That is, after a first user input represented by circle 1262 (e.g., a click on a selected second-level connection 1250A) is received, mapped second-level connections 1250B through 1250D are automatically selected in real time by the interactive routing system 300. As a subsequent user input representing horizontal cursor movement (represented by arrow 1263) is received, the initial third-level connection 1260A is extended and the initial third-level connection is intended to connect the second-level connection 1250A to another one or another set of second-level connections (not shown in FIG. 12C). As the same time, three cloned third-level connections 1260B through 1260D corresponding to the mapped second-level connections 1250B through 1250D are also automatically generated and displayed by the interactive routing system 300, and each of the cloned third-level connections is intended to connect a corresponding second-level connection to another second-level connection or another set of second-level connections.

Auto Via Drop Function

Figures 13A, 13B:
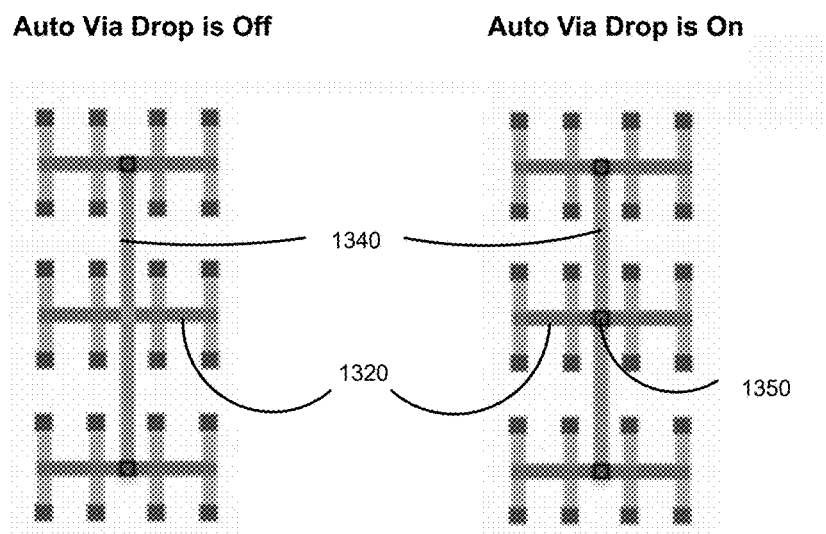
FIG. 13A is a diagram illustrating a connection when an auto via drop function is disabled, according to one embodiment.
FIG. 13B is a diagram illustrating a connection when an auto via drop function is enabled, according to one embodiment.

FIG. 13A is a diagram illustrating a connection when an auto via drop function is disabled, according to one embodiment. In some embodiments, the interactive routing system 300 enables two modes of routing connections: a mode that enables a via drop while a higher level routing connection is passing across a lower level routing connection, and the other mode where the via drop is not enabled. As shown in FIG. 13A, the auto via drop function is turned off, in which case, after the higher level connection 1340 passes across the lower level connection 1320, no via is added to the intersection between the two connections.

The auto via drop function allows the interactive routing system 300 allows vias to be added to possible locations (e.g., intersection between two or more different connections) conveniently, quickly and automatically with saved time and cost.

FIG. 13B is a diagram illustrating a connection when an auto via drop function is enabled, according to one embodiment. In this case, after the higher level connection 1340 passes across the lower level connection 1320, a via 1350 is added to the intersection between the two connections.

Example Process of Auto Welding or Auto Cloning

Figure 14:
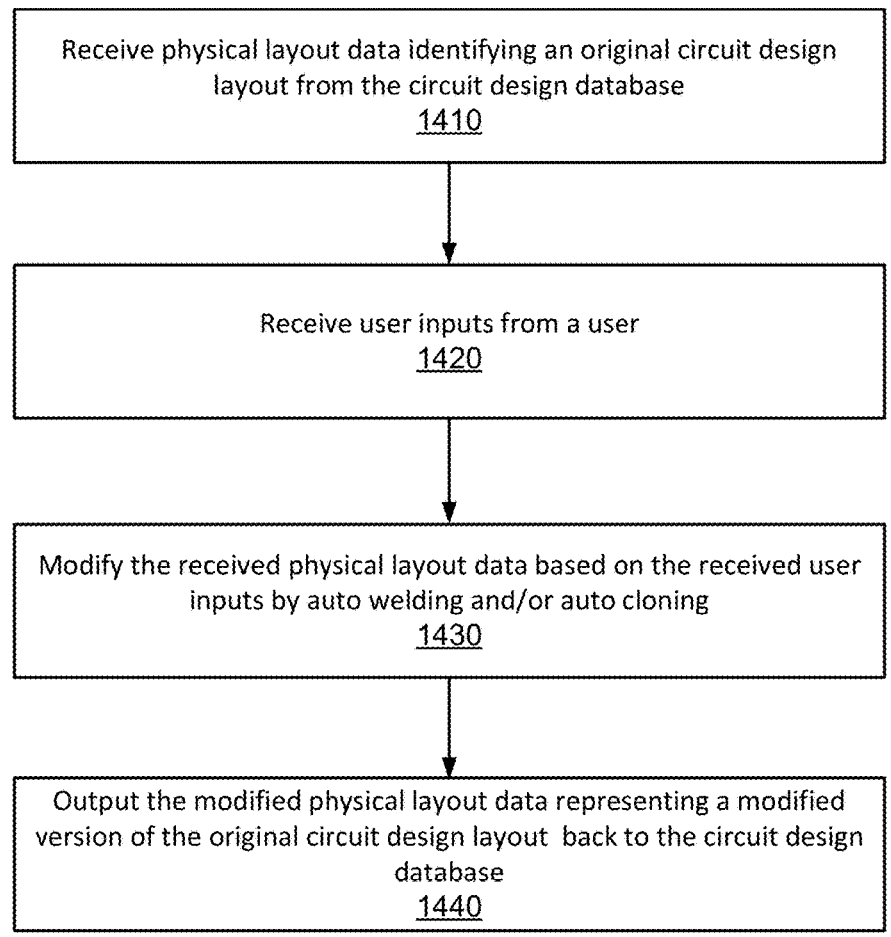
FIG. 14 is a flowchart illustrating a process of modifying physical layout data received from the circuit design database, according to one embodiment.

FIG. 14 is a flowchart illustrating a process of modifying physical layout data received from the circuit design database 350 by the interactive routing system 300, according to one embodiment. Initially, the interactive routing system 300 receives 1410 physical layout data identifying an original circuit design layout from the circuit design database 350.

The interactive routing system 300 receives 1420 user inputs from a user. The interactive routing system 300 modifies 1430 the received physical layout data based on the received user inputs by auto welding and/or auto cloning.

The interactive routing system 300 outputs 1440 the modified physical layout data 354 back to the circuit design database 350. In one embodiment, the process of receiving 1420 user inputs from the user and modifying 1430 the received physical layout data may be repeated for a number of times. Such modification of the physical layout data may be performed in real time with the receiving 1420 of the user inputs. In other embodiments, a batch of user inputs may be received 1420 before modifying 1430 the received physical layout data.

The flowchart shown in FIG. 14 is merely one example. For example, an additional process of performing compliance of design rules may be performed after receiving 1420 user inputs and modifying 1430 the received physical layout data.

Figure 15:
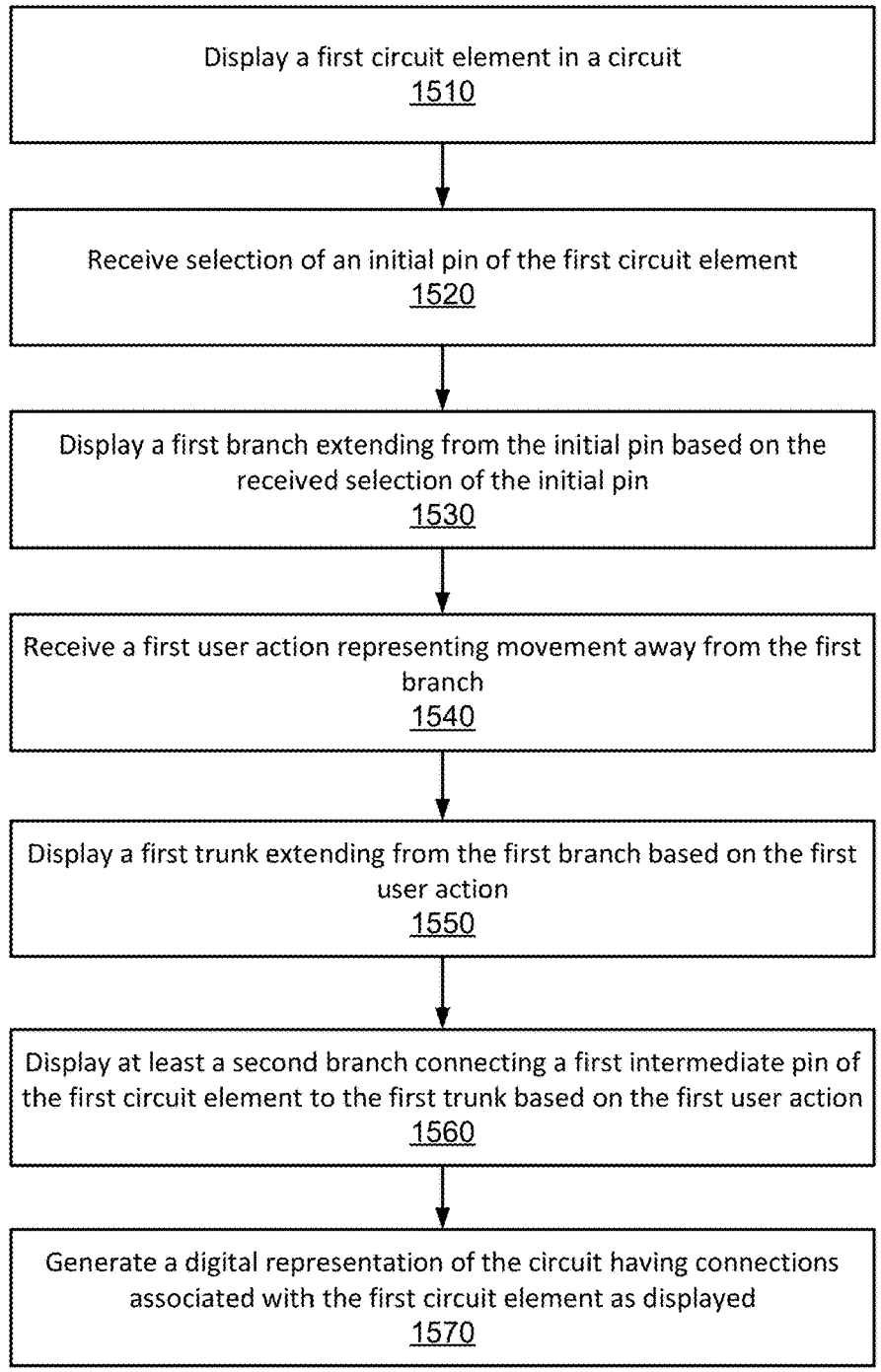
FIG. 15 is a flowchart illustrating a process of generating routing connections via auto welding, according to one embodiment.

FIG. 15 is a flowchart illustrating a process of generating routing connections via auto welding, according to one embodiment. Initially, the interactive routing system 300 displays 1510 a circuit element (e.g., a row of FETs) in a circuit.

In response to receiving 1520 selection of an initial pin of the circuit element, the interactive routing system 300 displays 1530 a first branch extending from the initial pin. The interactive routing system 300 receives 1540 a user input representing movement away from the first branch, and displays 1550 a trunk extending from the first branch based on the user input with the first branch connecting the initial pin to the first trunk.

The interactive routing system 300 also displays 1560 at least a second branch connecting an intermediate pin of the circuit element to the trunk based on the first user input representing the movement. The connection between the second branch trunk is established without receiving a separate user input selecting the intermediate pin.

The interactive routing system 300 also receives 1565 selection of an end pin of the circuit element. The end pin is separated from the initial pin by at least one intermediate pin.

The interactive routing system 300 generates 1570 a digital representation of the circuit having connections associated with the circuit element as displayed. The digital representation of the circuit may be saved in a database.

The flowchart shown in FIG. 15 is merely one example, and in alternative embodiments some steps are not required or additional or different steps need to be included. As one example, for received physical layout data requiring multi-level connections as shown in FIGS. 12A through 12C, additional steps may be performed to generate second-level or third-level connections.

Figure 16:
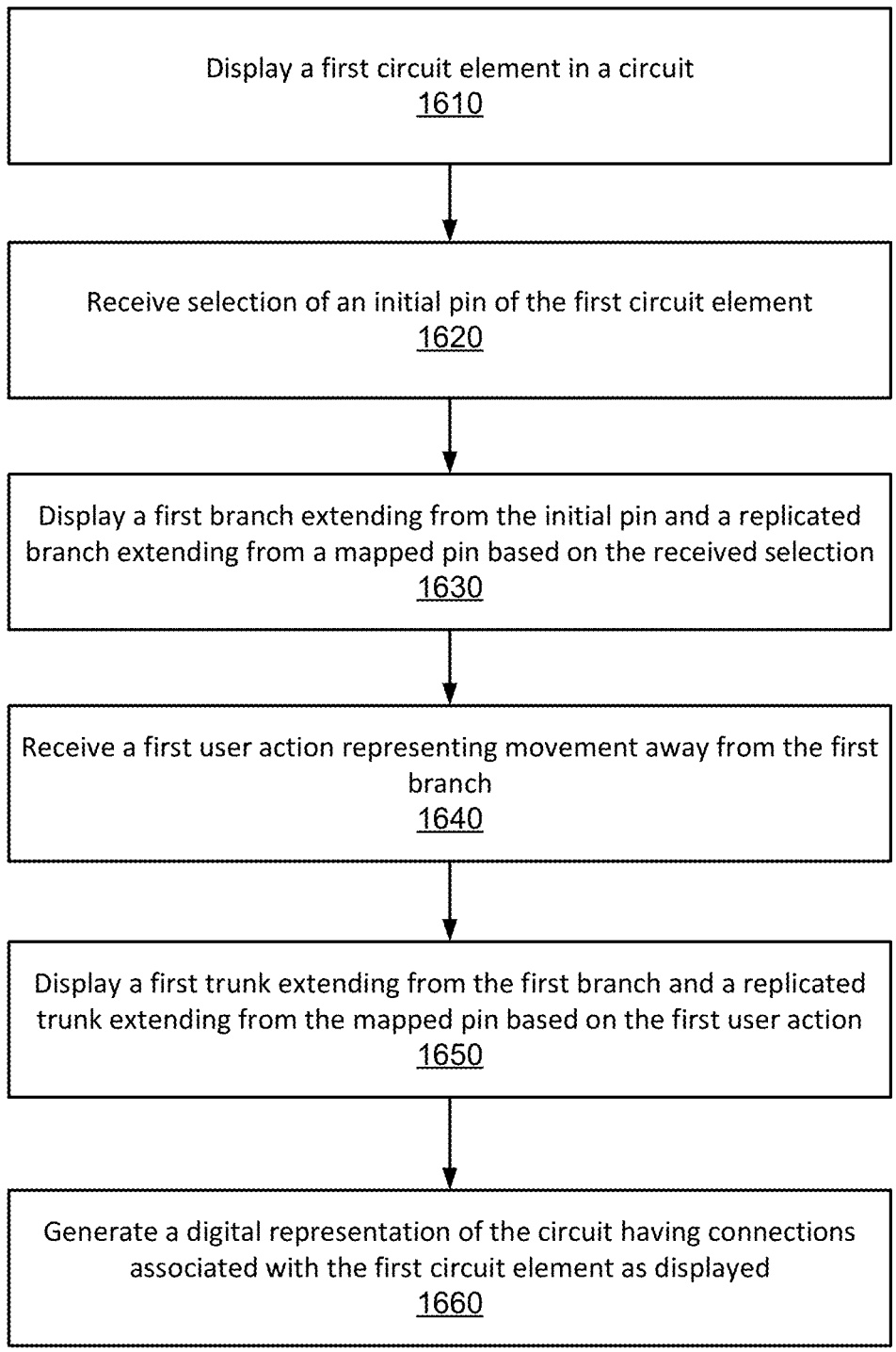
FIG. 16 is a flowchart illustrating a process of generating routing connections via auto cloning, according to one embodiment.

FIG. 16 is a flowchart illustrating a process of generating routing connections via auto cloning by the interactive routing system 300, according to one embodiment. The interactive routing system 300 receives 1610 mapping information indicating mapping of pins of at least one circuit element in the circuit.

The interactive routing system 300 receives 1620 selection of a first initial pin of the at least one circuit element where the mapping information indicating mapping of a second initial pin of the at least one circuit element to the first initial pin.

The interactive routing system 300 receives 1630 selection of a first end pin of the at least one circuit element after receiving the selection of the first initial pin, the mapping information indicating mapping of a second end pin of the at least one circuit element to the first end pin; and The interactive routing system 300 generates 1640 a digital representation of the circuit connecting the first initial pin to the first end pin and connecting the second initial pin to the second end pin without receiving a user input representing selection of the second initial pin or the second end pin. The digital representation of the circuit may be saved in a database.

The flowchart shown in FIG. 16 is merely one example, and in alternative embodiments some steps are not required or additional or different steps need to be included.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A method of routing connections in a digital representation of a circuit, the method comprising:
receiving a selection of a first initial pin of a digital representation of a circuit element in the circuit;
receiving a movement away from the first initial pin to extend a first connection from the first initial pin; and generating, by an electronic design automation (EDA) tool executed on a computing device, information on one or more second connections extending from one or more second initial pins determined by a length of the first connection, without receiving a user input representing a selection of the one or more second initial pins.

2. The method of claim 1, wherein the first connection and the one or more second connections extend in a direction parallel to a length of the circuit element.

3. The method of claim 1, wherein each second connection of the one or more second connections has a same length as the first connection.

4. The method of claim 1, further comprising receiving a selection of a first end pin that determines the length of the first connection, the one or more second connections determined by the selection of the first end pin.

5. The method of claim 1, further comprising:
displaying dynamically a change in a length of the first connection and a change in lengths of the one or more second connections as the movement away from the first initial pin is received.

6. The method of claim 5, further comprising:
displaying merging of the first connection with one second connection of the one or more second connections into an updated first connection and one or more updated second connections as the movement away from the first initial pin is received.

7. The method of claim 1, wherein the first and second circuit elements are Fin Field Effect Transistor (FinFET).

8. A method of routing connections in a digital representation of a circuit, the method comprising:
receiving a selection of a first pin of a digital representation of a first circuit element in the circuit;
receiving a movement away from the first pin to a target pin of a second circuit element; and
responsive to the second circuit element present in a path between the first pin to the target pin of the second circuit element, generating, by an electronic design automation (EDA) tool executed on a computing device, without receiving a selection of a second pin of the second circuit element:
first information on a first connection extending from the first pin to the second pin of the second circuit element, and
second information on a second connection extending from the second pin of the second circuit element to the target pin.

9. The method of claim 8, wherein the first connection and the second connection extend in a direction parallel to a length of the first circuit element and the second circuit element.

10. The method of claim 8, further comprising receiving a selection of the target pin to determine the first connection and the second connection.

11. The method of claim 8, further comprising generating third information on third connections from third pins of the first circuit element to corresponding pins of the second circuit element responsive to receiving the movement away from the first pin to the target pin, the second pin mapped to the first pin.

12. The method of claim 11, further comprising generating fourth information on fourth connections from the corresponding pins of the second circuit element to the second connection.

13. The method of claim 8, further comprising:
displaying dynamically a change in the first connection and a change in the second connection as the movement away from the first pin is received.

14. The method of claim 8, wherein the first circuit element and the second circuit element are Fin Field Effect Transistors (FinFETs).

15. A non-transitory computer readable storage medium storing instructions thereon, the instructions when executed by a processor cause the processor to:
receive a selection of a first initial pin of a digital representation of a circuit element in the circuit;
receive a movement away from the first initial pin to extend a first connection from the first initial pin; and
generate information on one or more second connections extending from one or more second initial pins determined by a length of the first connection, without receiving a user input representing a selection of the one or more second initial pins.

16. The non-transitory computer readable storage medium of claim 15, wherein the first connection and the one or more second connections extend in a direction parallel to a length of the circuit element.

17. The non-transitory computer readable storage medium of claim 15, wherein each second connection of the one or more second connections has a same length as the first connection.

18. The non-transitory computer readable storage medium of claim 15, further storing instruction causing the processor to receive a selection of a first end pin that determines the length of the first connection, the one or more second connections determined by the selection of the first end pin.

19. A non-transitory computer readable storage medium storing instructions thereon, the instructions when executed by a processor cause the processor to:
receive a selection of a first pin of a digital representation of a first circuit element in a circuit;
receive a movement away from the first pin to a target pin of a second circuit element; and
responsive to the second circuit element present in a path between the first pin to the target pin of the second circuit element, generate, without receiving a selection of a second pin of the second circuit element:
first information on a first connection extending from the first pin to the second pin of the second circuit element, and
second information on a second connection extending from the second pin of the second circuit element to the target pin.

20. The non-transitory computer readable storage medium of claim 19, wherein the first connection and the second connection extend in a direction parallel to a length of the first element and the second circuit element.

\* \* \* \* \*